(12) United States Patent
Nozaki et al.

(10) Patent No.: US 9,946,396 B2
(45) Date of Patent: Apr. 17, 2018

(54) TRANSPARENT ELECTRODE CAPACITANCE SENSOR AND PROCESS FOR MANUFACTURING THE SAME

(71) Applicant: SHIN-ETSU POLYMER CO., LTD., Tokyo (JP)

(72) Inventors: Tomohiro Nozaki, Kumagaya (JP); Hiroto Komatsu, Yokohama (JP); Takashi Kawamura, Tokyo (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 0 days.

(21) Appl. No.: 15/036,633

(22) PCT Filed: Dec. 12, 2014

(86) PCT No.: PCT/JP2014/082942
§ 371 (c)(1),
(2) Date: May 13, 2016

(87) PCT Pub. No.: WO2015/093397
PCT Pub. Date: Jun. 25, 2015

(65) Prior Publication Data
US 2016/0266707 A1 Sep. 15, 2016

(30) Foreign Application Priority Data

Dec. 19, 2013 (JP) .................. 2013-262827
Jan. 21, 2014 (JP) .................. 2014-008945
Apr. 28, 2014 (JP) .................. 2014-092625

(51) Int. Cl.
*G06F 3/045* (2006.01)
*G06F 3/041* (2006.01)
(Continued)

(52) U.S. Cl.
CPC .......... *G06F 3/0416* (2013.01); *G01R 27/00* (2013.01); *G06F 3/044* (2013.01);
(Continued)

(58) Field of Classification Search
CPC ............................ G06F 3/044; G06F 3/03545
See application file for complete search history.

(56) References Cited

U.S. PATENT DOCUMENTS

2011/0234526 A1* 9/2011 Mi ........................... H05K 3/30
345/174
2011/0298728 A1 12/2011 Kim et al.
(Continued)

FOREIGN PATENT DOCUMENTS

JP 2011-258172 A 12/2011
JP 2012-133673 A 7/2012
(Continued)

OTHER PUBLICATIONS

Jul. 4, 2016 Office Action issued in Japanese Patent Application No. 2013-262827.
(Continued)

*Primary Examiner* — Nan-Ying Yang
(74) *Attorney, Agent, or Firm* — Oliff PLC

(57) ABSTRACT

A transparent electrode capacitance sensor includes a transparent resin substrate; at least one transparent electrode formed on the transparent resin substrate; a pseudo auxiliary electrode formed in at least a portion of an outer periphery of the transparent electrode; and a lead wire connected to the pseudo auxiliary electrode, wherein the pseudo auxiliary electrode is thicker than the transparent electrode, and includes the same material as the transparent electrode.

9 Claims, 22 Drawing Sheets

(51) Int. Cl.
*G06F 3/044* (2006.01)
*G01R 27/00* (2006.01)
(52) U.S. Cl.
CPC ............. *G06F 2203/04102* (2013.01); *G06F 2203/04103* (2013.01); *G06F 2203/04112* (2013.01)

(56) References Cited

U.S. PATENT DOCUMENTS

| | | |
|---|---|---|
| 2013/0181727 A1 | 7/2013 | Nishizawa et al. |
| 2015/0153885 A1* | 6/2015 | Endo .................. G06F 3/045 345/174 |

FOREIGN PATENT DOCUMENTS

| | | | |
|---|---|---|---|
| JP | 2012-178149 A | | 9/2012 |
| JP | 2013-089305 A | | 5/2013 |
| JP | 2013-152530 A | | 8/2013 |
| JP | 2013152530 A | * | 8/2013 |
| JP | 2014-010516 A | | 1/2014 |

OTHER PUBLICATIONS

Mar. 10, 2015 Search Report issued in International Patent Application No. PCT/JP2014/082942.
Jun. 21, 2016 International Preliminary Report on Patentability issued in International Patent Application No. PCT/JP2014/082942.
May 2, 2017 Office Action issued in Japanese Patent Application No. 2014-008945.

* cited by examiner

[FIG. 1A]
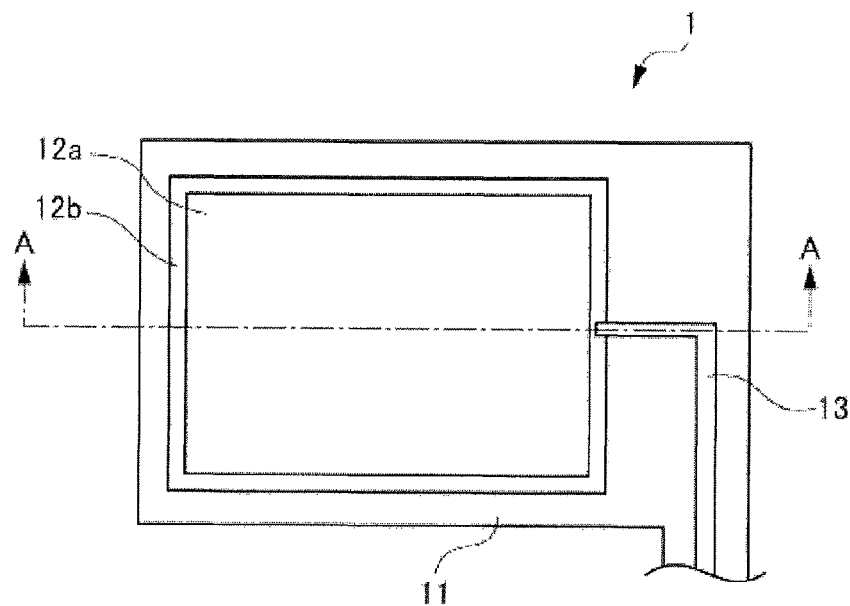
[FIG. 1B]
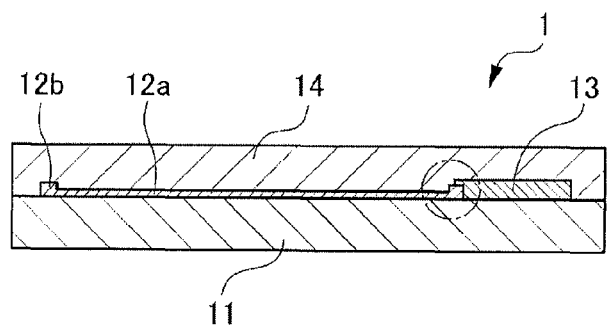
[FIG. 1C]
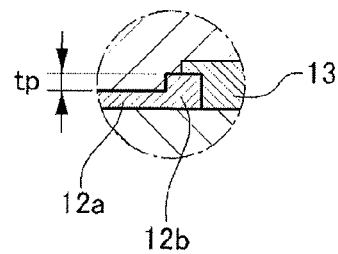

[FIG. 2]
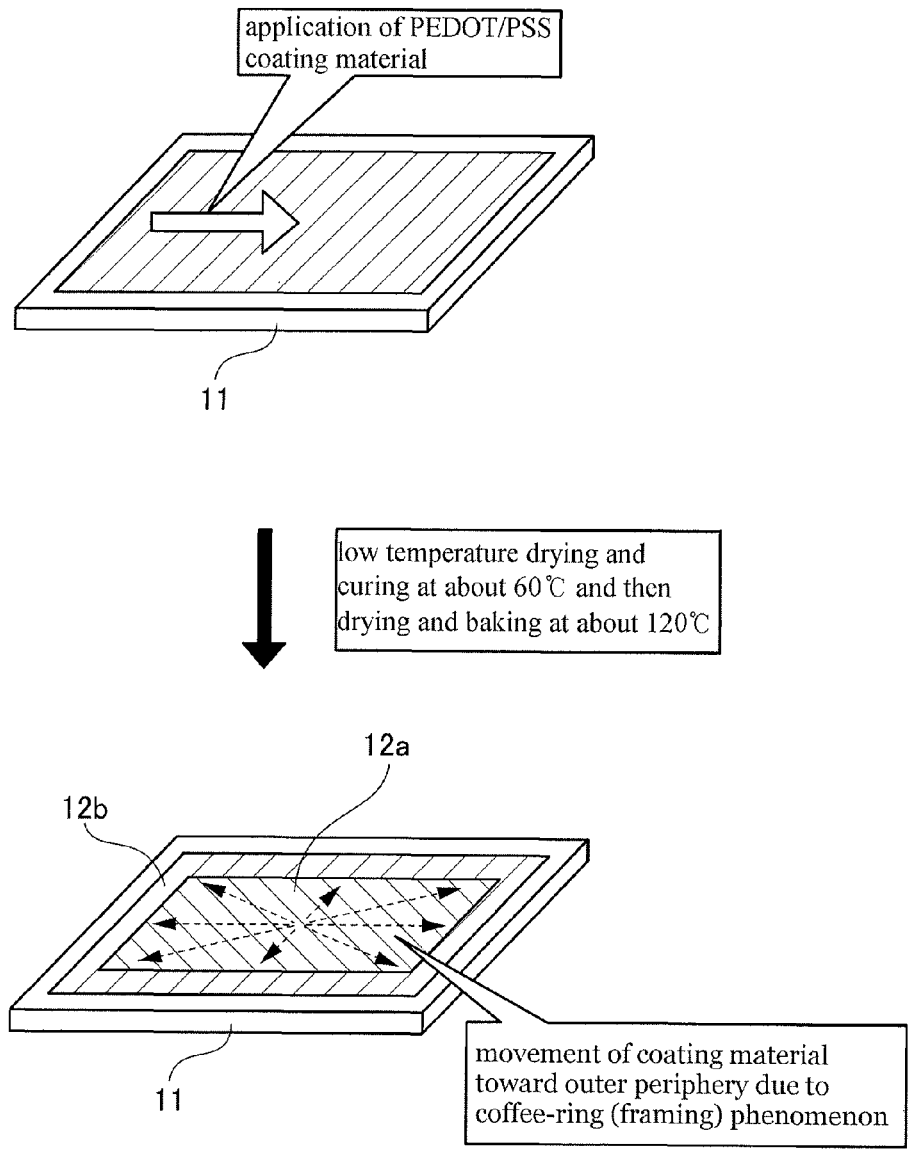

[FIG. 3A]
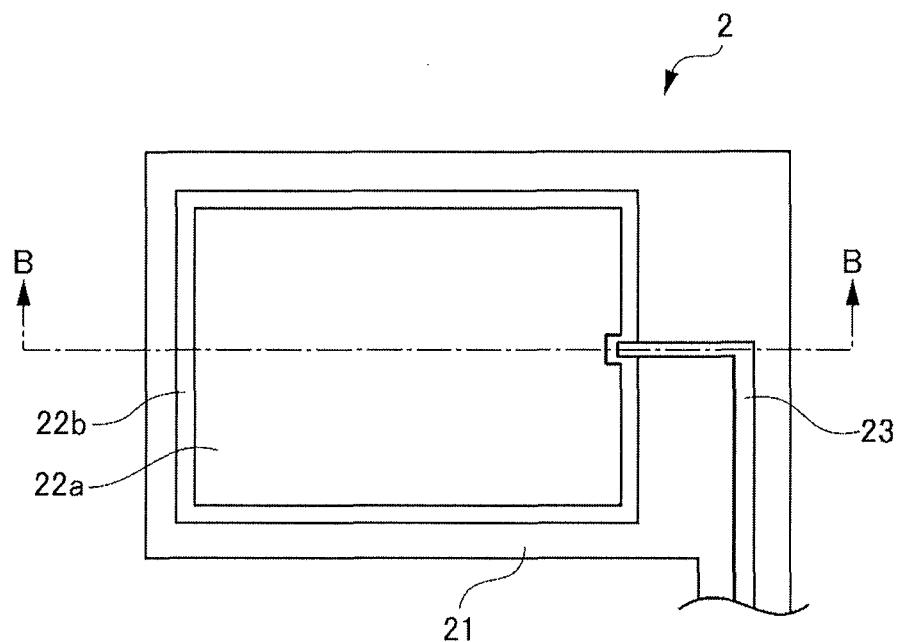
[FIG. 3B]
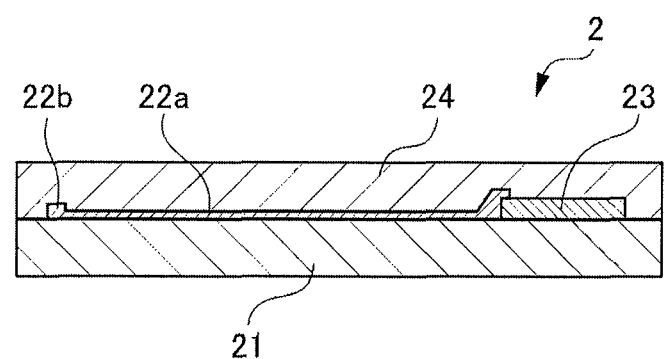

[FIG. 4A]
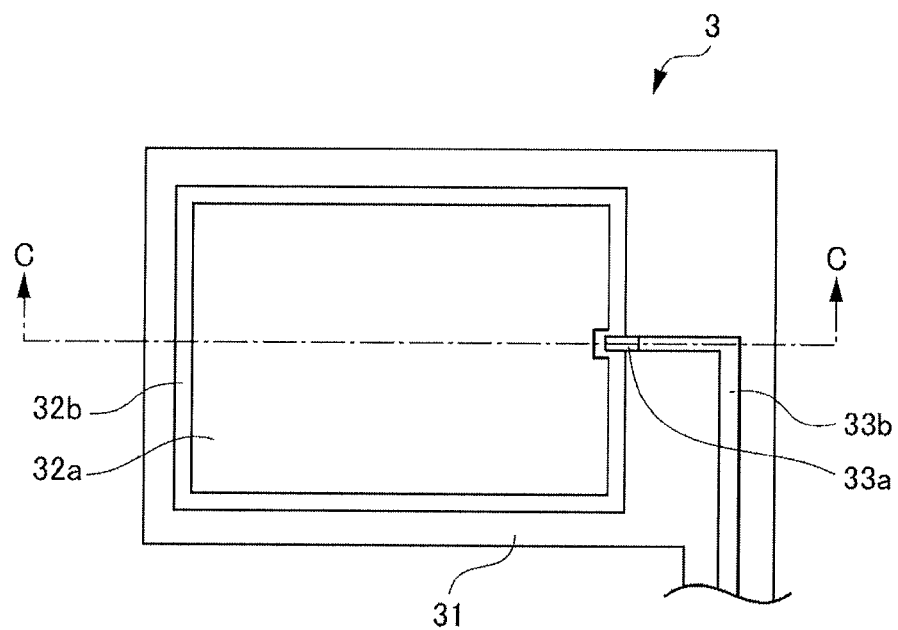
[FIG. 4B]
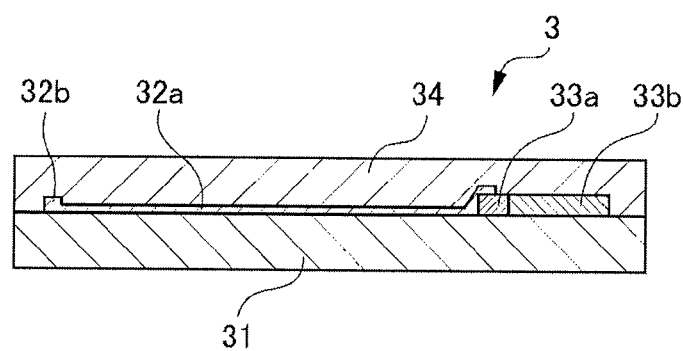

[FIG. 5]
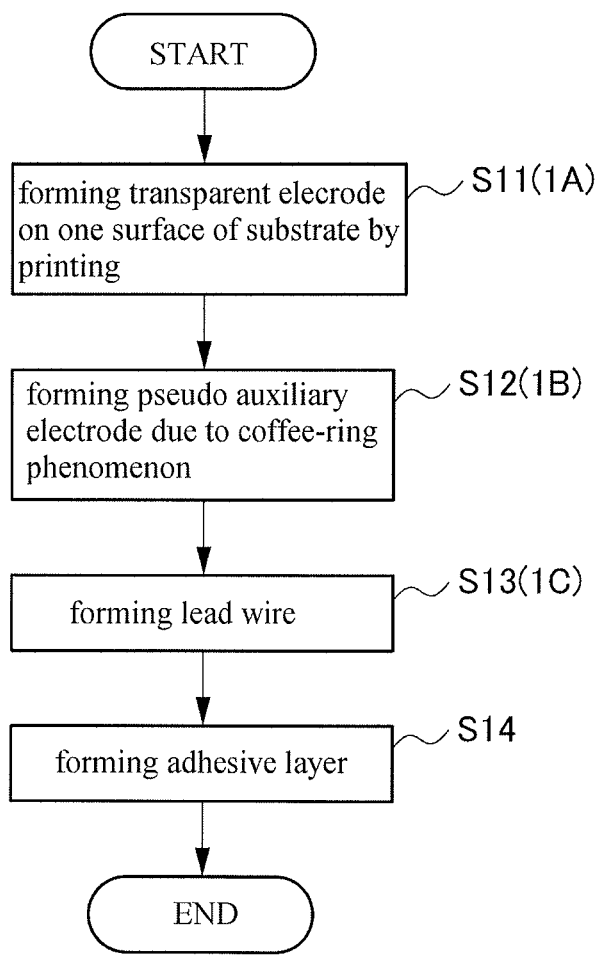

[FIG. 6]
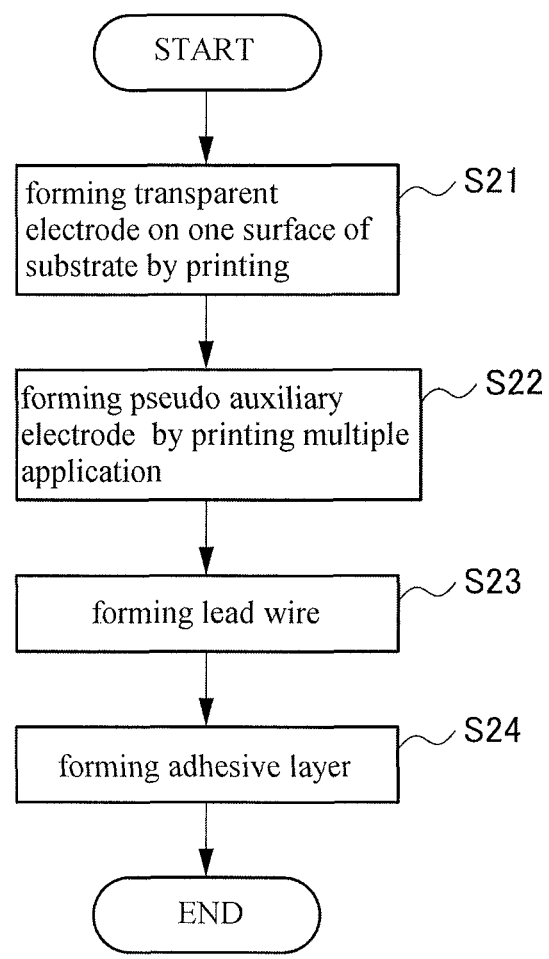

[FIG. 7]
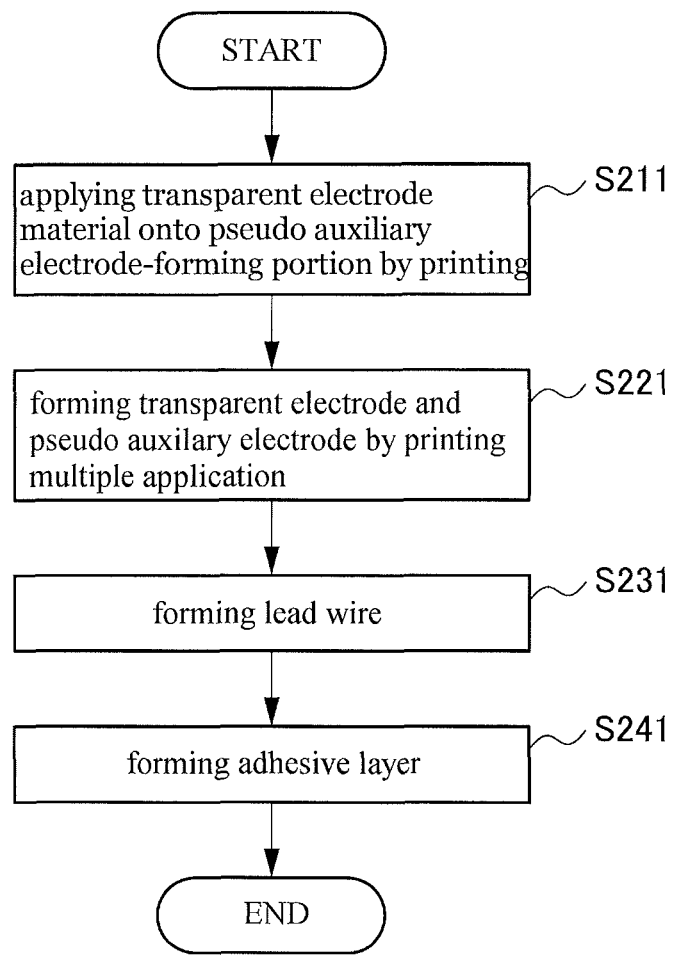

[FIG. 8A]
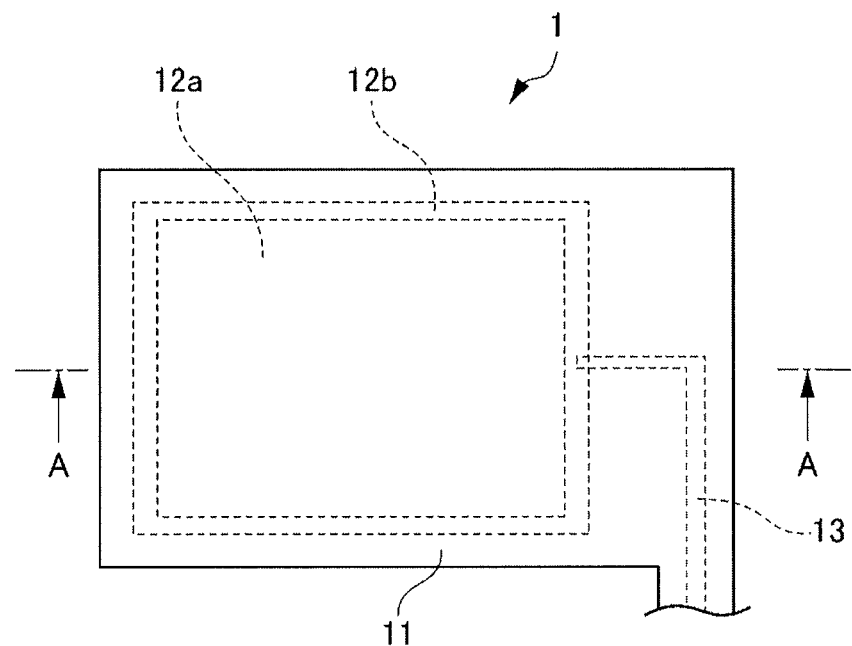
[FIG. 8B]
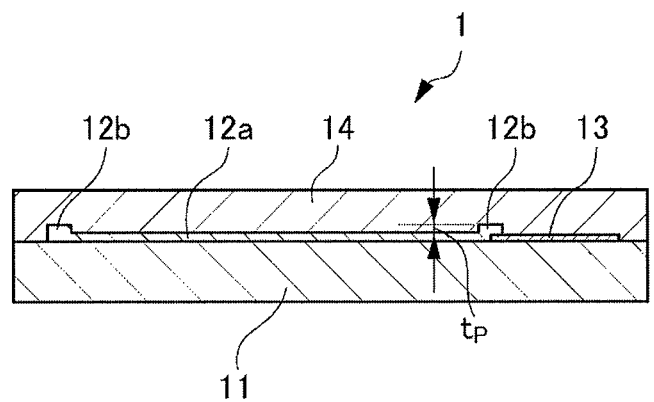

[FIG. 9]
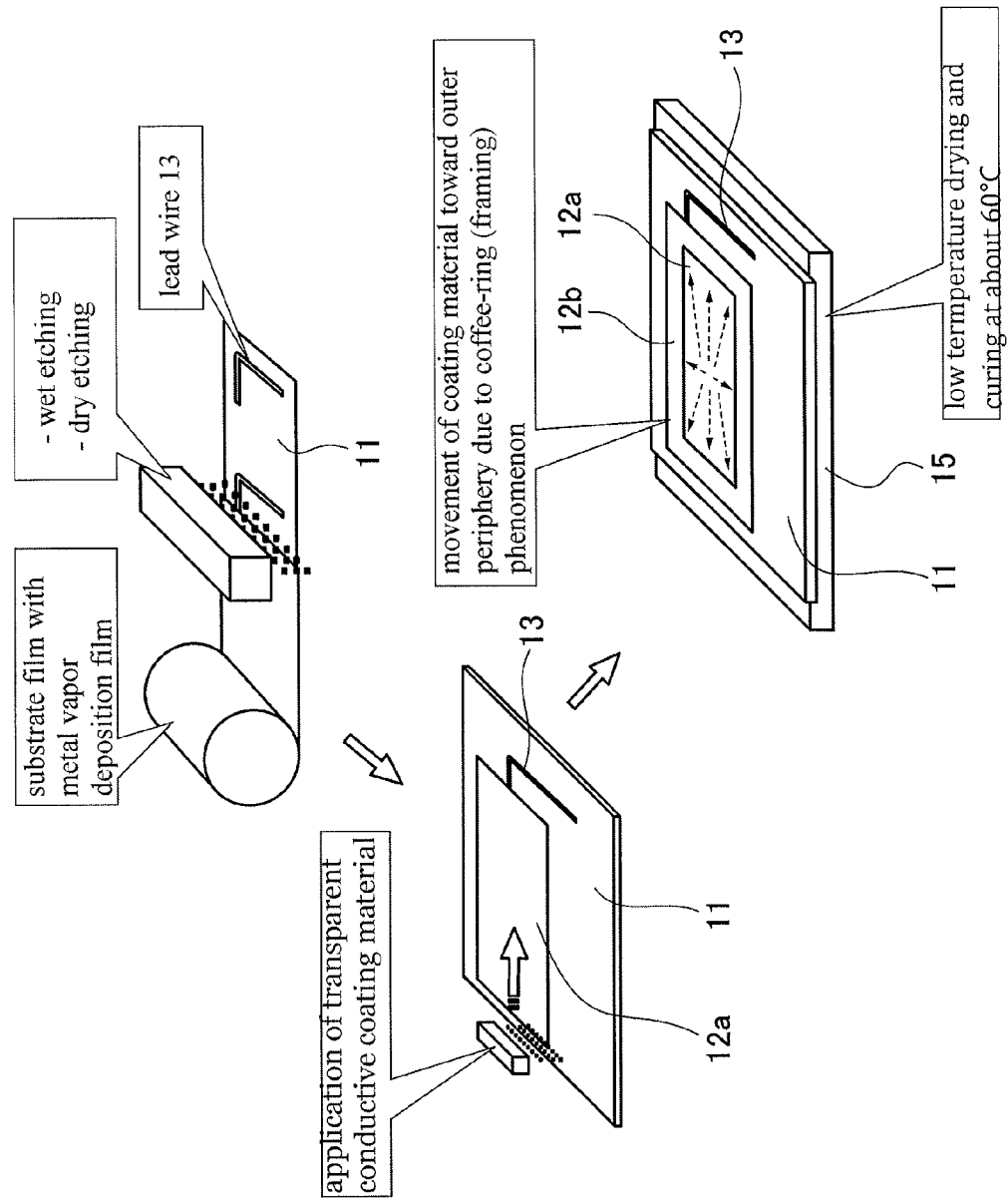

[FIG. 10A]
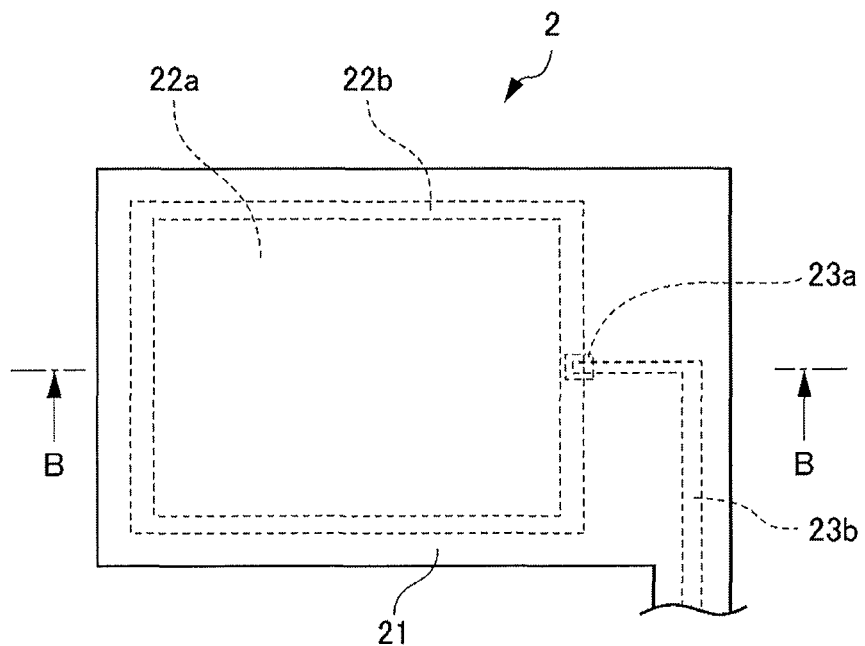
[FIG. 10B]
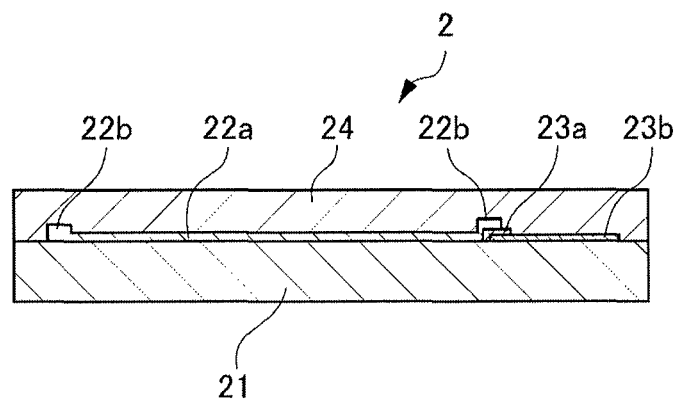

[FIG. 11A]
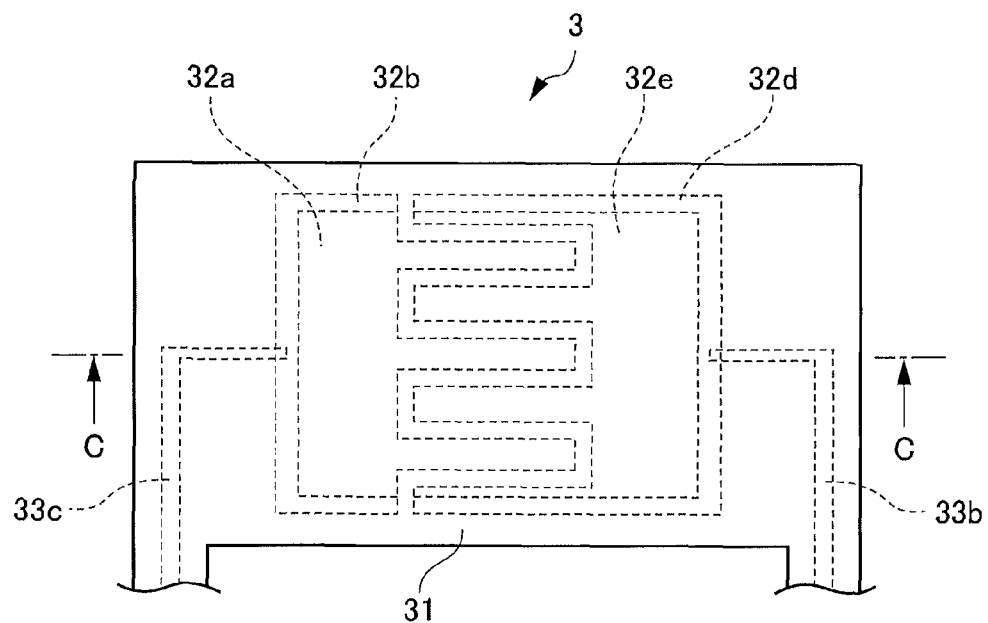
[FIG. 11B]
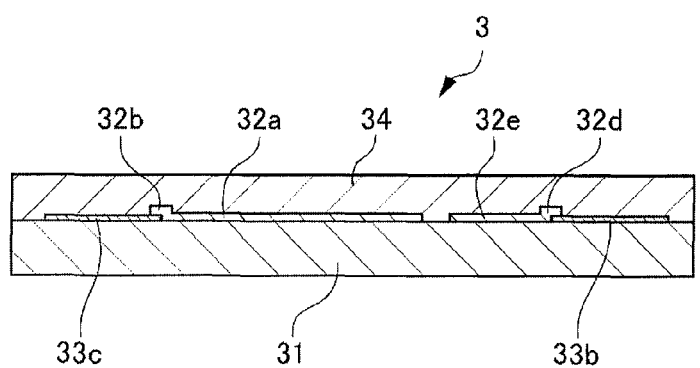

[FIG. 12]
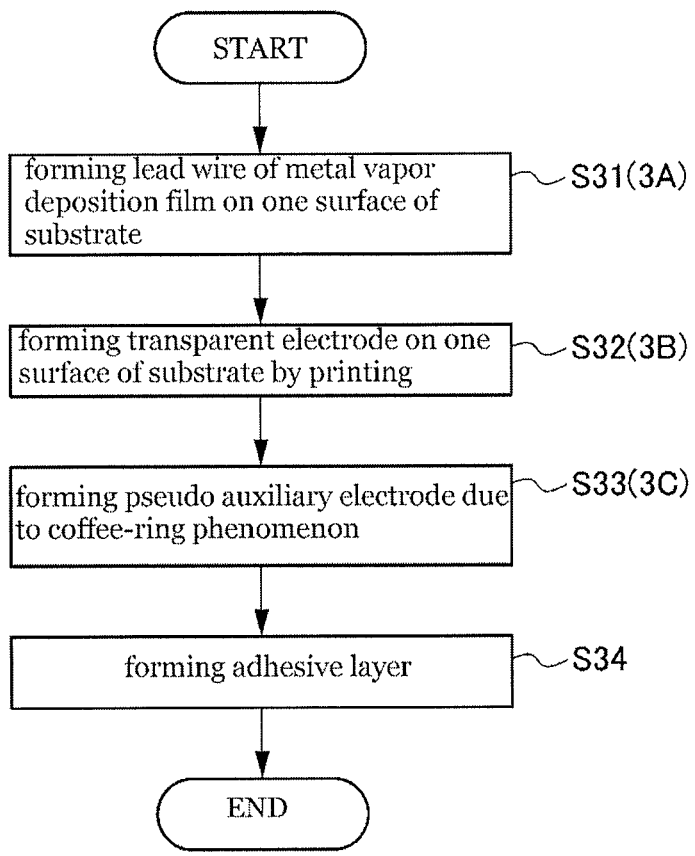

[FIG. 13]
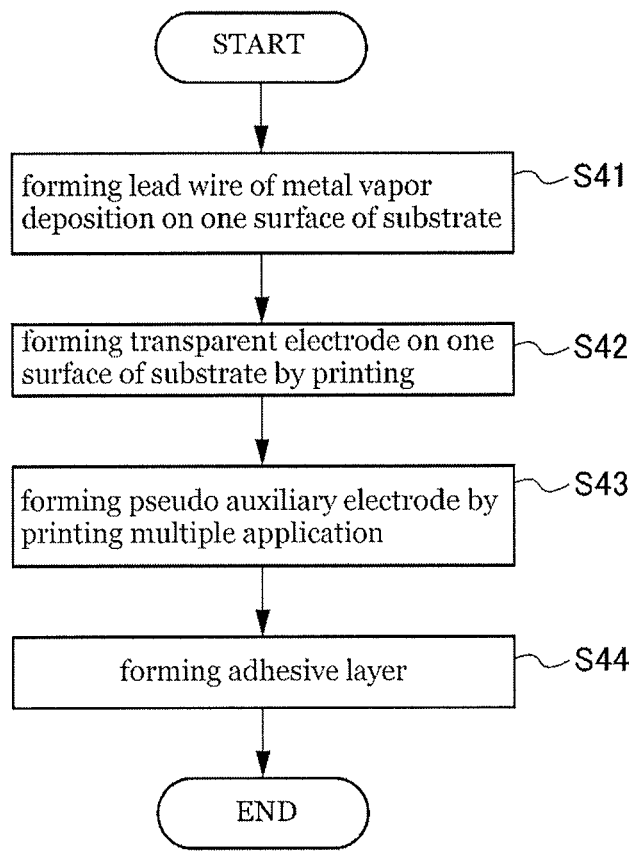

[FIG. 14]
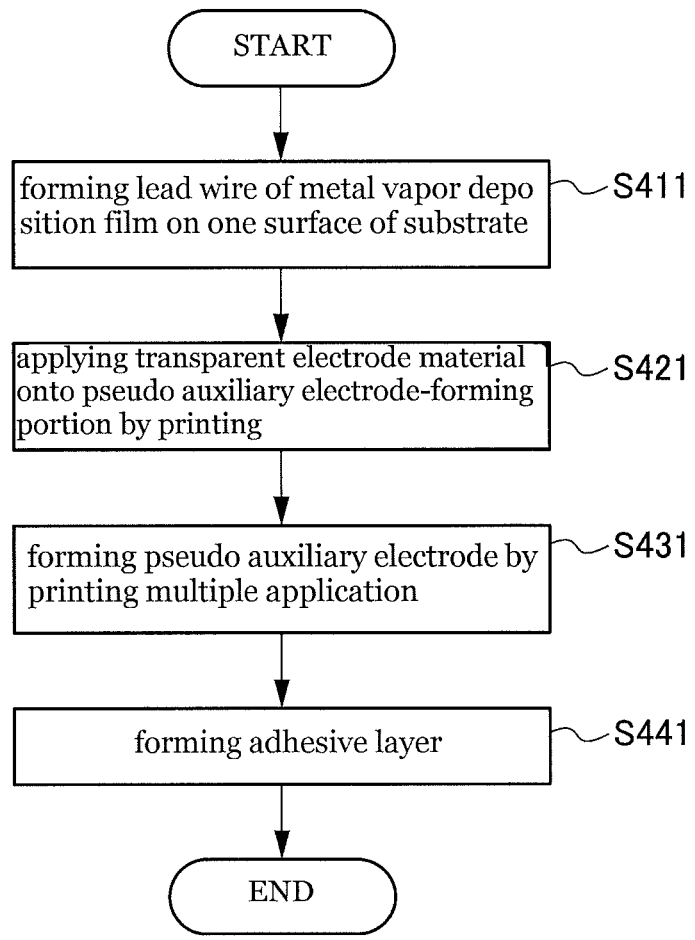

[FIG. 15A]
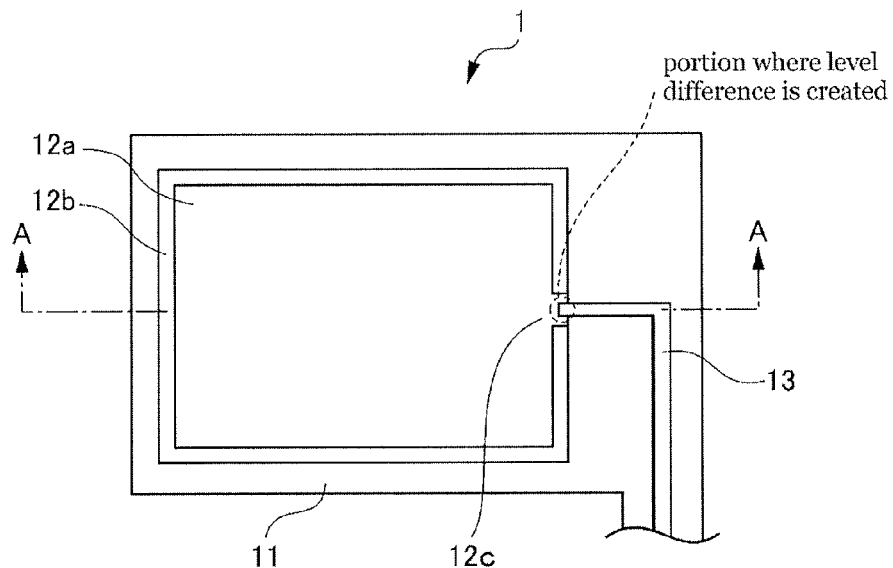
[FIG. 15B]
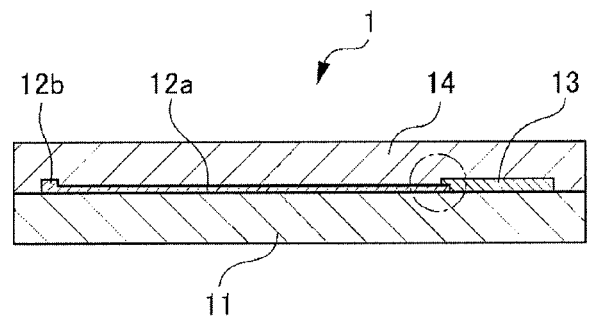
[FIG. 15C]
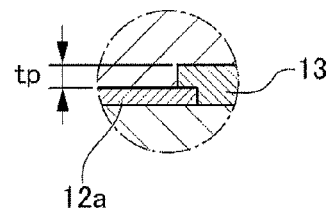

[FIG. 16]
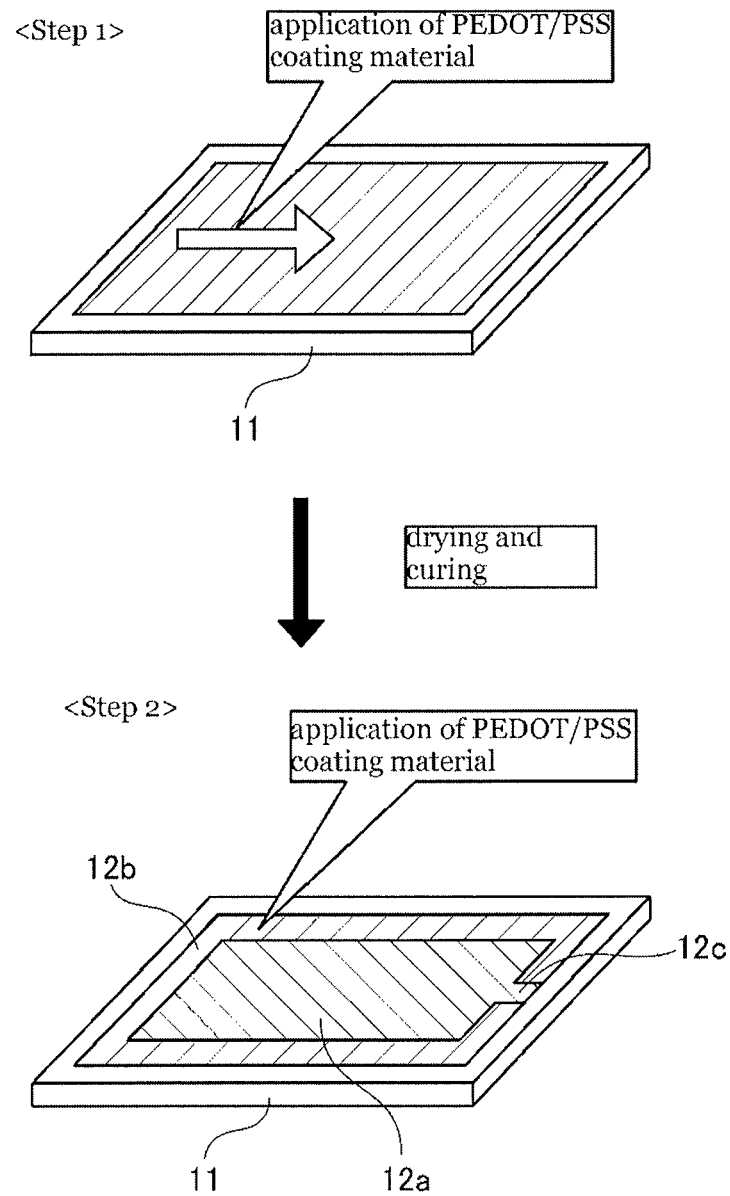

[FIG. 17A]
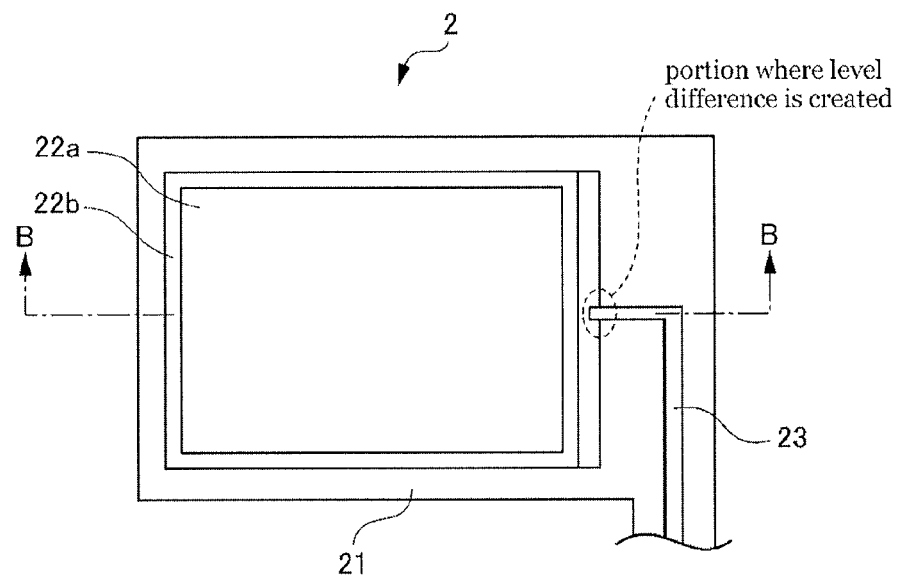
[FIG. 17B]
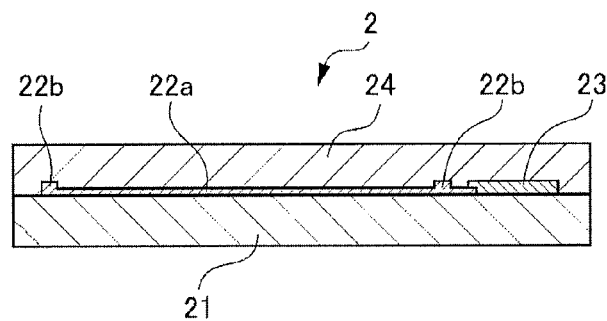

[FIG. 18A]
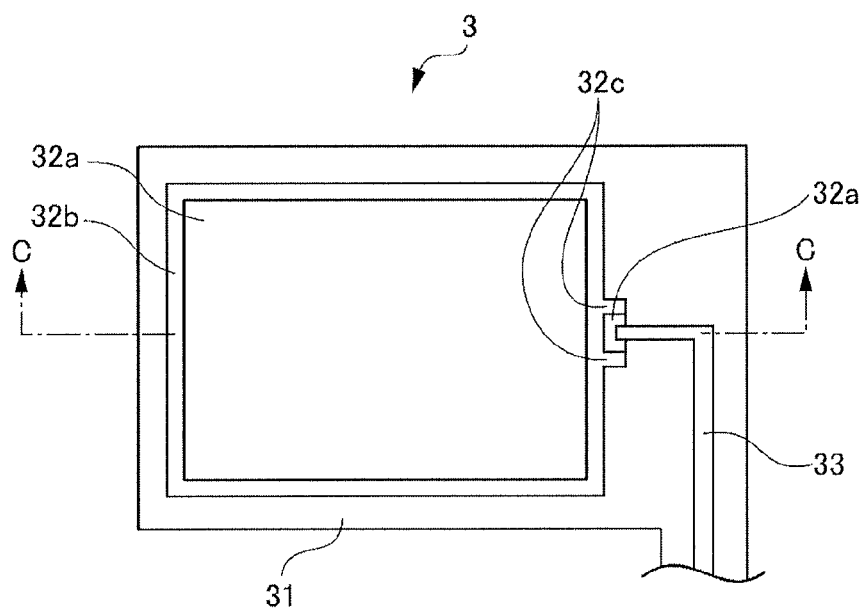
[FIG. 18B]
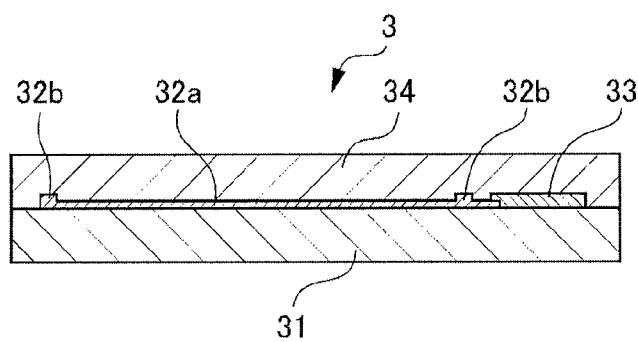

[FIG. 19A]
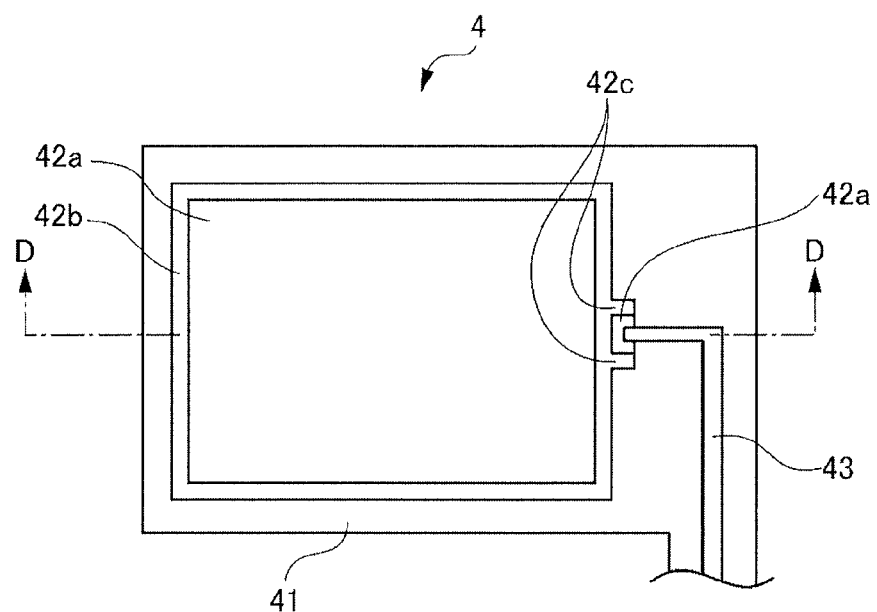
[FIG. 19B]
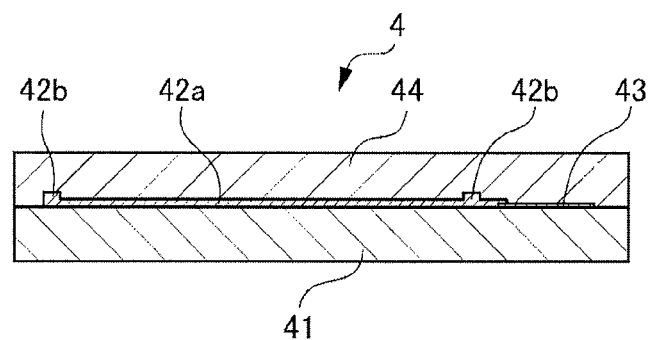

[FIG. 20A]
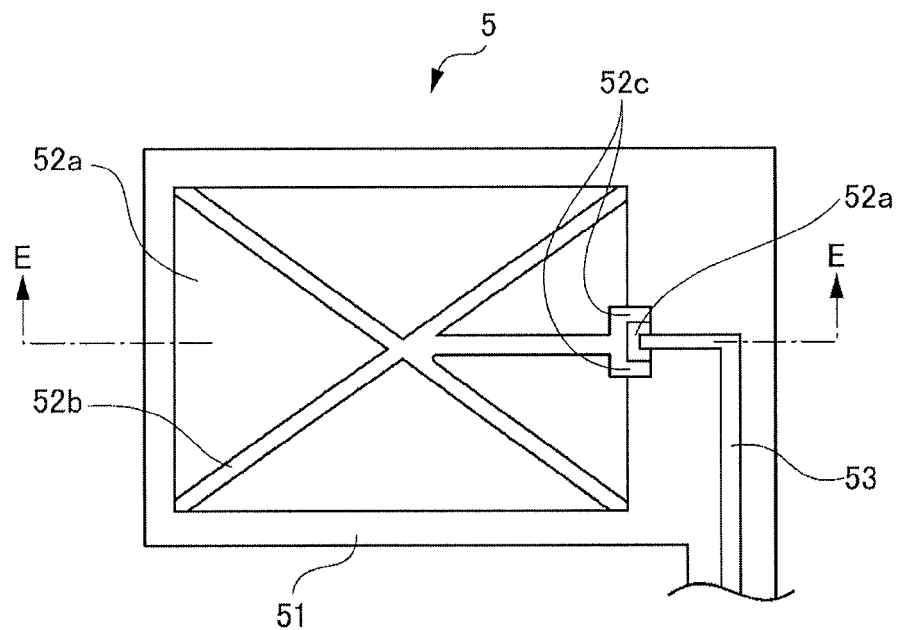
[FIG. 20B]
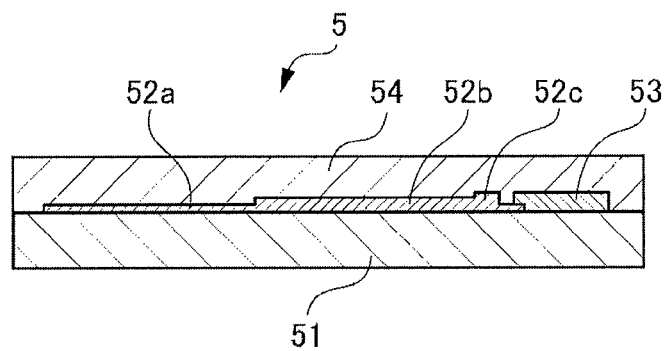

[FIG. 21A]
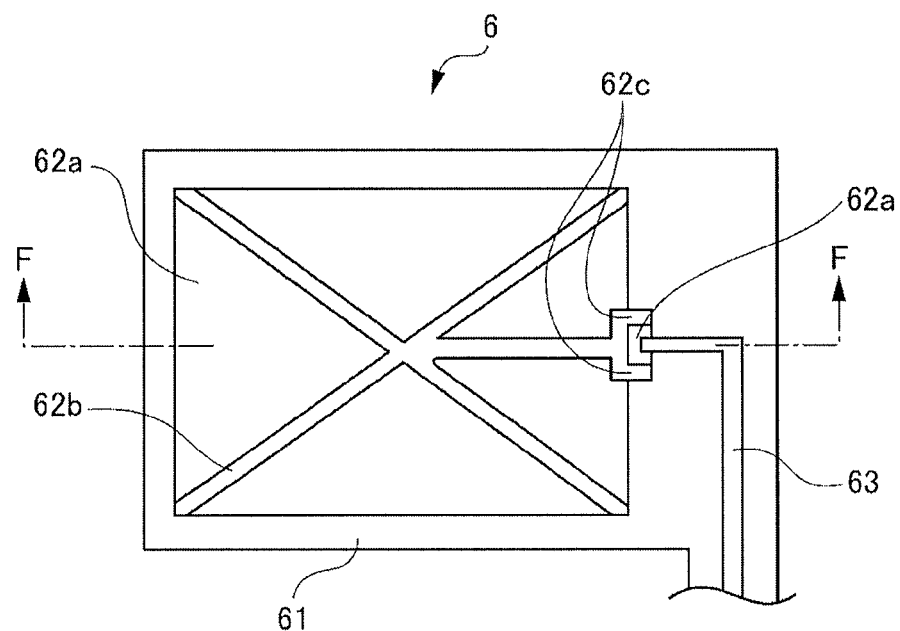
[FIG. 21B]
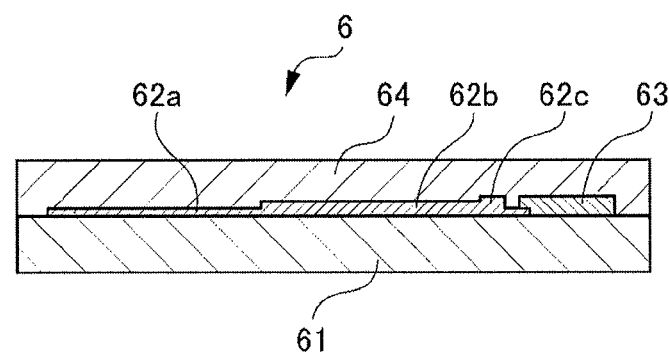

[FIG. 22]
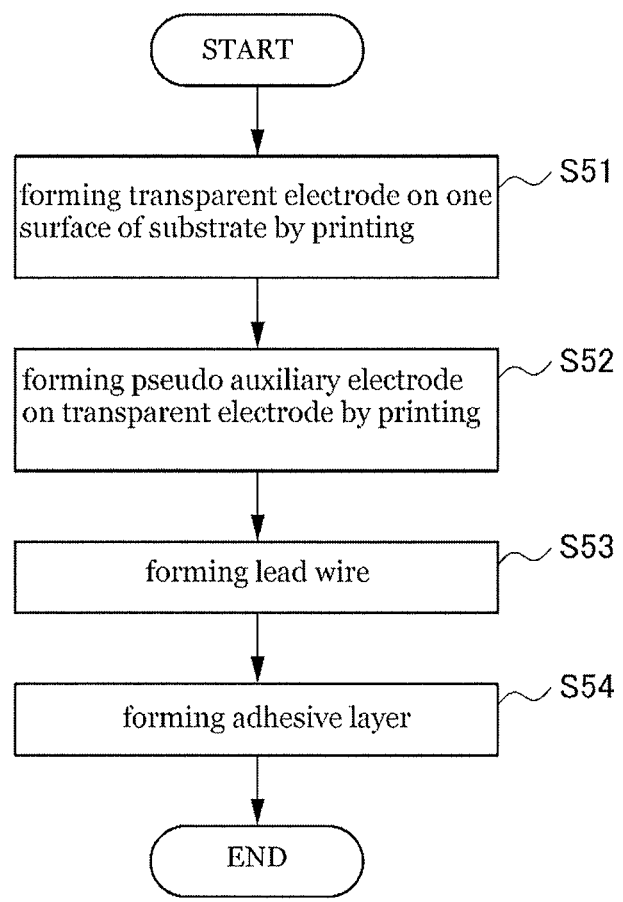

TRANSPARENT ELECTRODE CAPACITANCE SENSOR AND PROCESS FOR MANUFACTURING THE SAME

TECHNICAL FIELD

The present invention relates to a transparent electrode capacitance sensor and a process for manufacturing the transparent electrode capacitance sensor.

BACKGROUND ART

A detection of a touch sensor includes a capacitance-type detection which responds to an electric power which flows through a finger in contact with a screen to transform the motion of the finger into an operation command. There is disclosed a capacitance sensor using such a capacitance-type detection in which an auxiliary electrode having an electric resistance lower than that of a transparent electrode is formed in at least a portion of the periphery of the transparent electrode so as to suppress a variation in detection sensitivity. For more detail, see, for example, Patent Document 1.

However, in a case where misalignment between the transparent electrode and the auxiliary electrode occurs during the manufacture of the sensor as disclosed in Patent Document 1, the conduction area between the transparent electrode and the auxiliary electrode may be variable depending on an amount of misalignment. If the transparent electrode and the auxiliary electrode are intended to be precisely aligned in order to avoid such a variation in the conduction area between the transparent electrode and the auxiliary electrode due to the misalignment, the process for manufacturing the sensor become inevitably complicated. In order to overcome this drawback, there has been proposed that the contour line of a light transmitting resist is located on the contour line of the transparent electrode which is not covered by the auxiliary electrode to improve the positioning accuracy between the transparent electrode and the auxiliary electrode. For more detail, see, for example, Patent Document 2.

However, Patent Document 1 teaches conductive paste containing conductive metallic material with low resistance such as silver ink or a metallic layer as the material for the auxiliary electrode, and Patent Document 2 teaches an ink containing metallic particles of silver, copper, gold and the like, an ink containing carbon or graphite, a metallic film and the like as the material for the auxiliary electrode. In a case where the auxiliary electrode is formed of the material which is different from the material for the transparent electrode, as described in Patent Document 1 and Patent Document 2, the problems or drawbacks are as follows: (i) the auxiliary electrode which is disposed at the periphery of the transparent electrode outstands to compromise the appearance or designing properties; (ii) as there is created a great level difference between the transparent electrode and the auxiliary electrode, during the formation of an covering over these transparent and auxiliary electrode, air bubble entrapped in the covering leads to the increase in parasitic capacitance; (iii) due to the auxiliary electrode the viewable area of the transparent electrode is reduced; and (iv) as the material such as silver and gold is expensive, material cost increases.

CITATION LIST

Patent Literature

Japanese patent publication No. 2012-133673 (A)
Japanese patent publication No. 2012-178149 (A)

SUMMARY OF INVENTION

Technical Problem

In order to solve the above drawbacks and problems, the present invention provides a transparent electrode capacitance sensor which is excellent in designing properties, secures wide viewable area, and reduces the level difference between the transparent electrode and the auxiliary electrode to suppress bubbling and resultant parasitic capacitance. In addition, the transparent electrode capacitance sensor can realize an excellent reliability and save the cost for material. The present invention also provides a process for manufacturing the same transparent electrode capacitance sensor.

Solution to Problem (1) In a first aspect, the present invention provides a transparent electrode capacitance sensor, which has a transparent resin substrate; at least one transparent electrode formed on the transparent resin substrate; a pseudo auxiliary electrode formed in at least a portion of an outer periphery of the transparent electrode; and a lead wire connected to the pseudo auxiliary electrode. The pseudo auxiliary electrode is thicker than the transparent electrode, and comprises the same material as the transparent electrode.

(2) In the above (1), the lead wire may be formed on the transparent resin substrate, and have a metal vapor deposition film.

(3) In the above (1) or (2), the lead wire may be connected to the pseudo auxiliary electrode through the transparent electrode.

(4) In any of the above (1) to (3), a thickness of the pseudo auxiliary electrode may be greater than that of the transparent electrode by 6 μm or below.

(5) In any of the above (1) or (2), a thickness of the pseudo auxiliary electrode may be greater than that of the transparent electrode by 4 μm or below.

(6) In any of the above (1) to (3), the pseudo auxiliary electrode may be formed in an extent of ½ or above of the periphery of the transparent electrode.

(7) In the above (2) or (3), the lead wire may have a thickness of from 0.1 μm to 3 μm.

(8) In the above (2), the lead wire may further have a carbon layer formed in a connection between the lead wire and the pseudo auxiliary electrode, and the lead wire may be connected to the pseudo auxiliary electrode through the carbon layer.

(9) In the above (3), the lead wire may be spaced apart from the pseudo auxiliary electrode by one to ten times greater than a thickness of the lead wire in a plan view.

(10) In the above (3), the lead wire may further have a carbon layer on the lead wire, and a portion of the lead wire on which the carbon layer is formed may be connected to the pseudo auxiliary electrode through the transparent electrode.

(11) In a second aspect, the present invention provides a process of manufacturing a transparent electrode capacitance sensor, which comprises: a step (1A) of providing a transparent conductive material having a viscosity enough to cause a coffee-ring phenomenon on a transparent resin substrate; a step (1B) of drying and curing the transparent conductive material under a condition enough to cause the coffee-ring phenomenon so as to form a transparent electrode and a pseudo auxiliary electrode which is disposed at an outer periphery of the transparent electrode and thicker than the transparent electrode; and a step (1C) of forming a lead wire connected to the pseudo auxiliary electrode.

(12) In the above (11), the process may further comprise, after step (1B), a step of (1B2) of increasing a thickness of at least a portion of the pseudo auxiliary electrode, wherein, in the step (1B2), a layer comprising the same transparent conductive material is formed on at least a portion of the pseudo auxiliary electrode in accordance with a printing method.

(13) In a third aspect, the present invention provides a process for manufacturing a transparent electrode capacitance sensor, which comprises: a step (3A) of forming a lead wire comprising a metal vapor deposition film on a transparent resin substrate; a step (3B) of providing a transparent conductive material having a viscosity enough to cause a coffee-ring phenomenon on the transparent resin substrate such that a portion of the transparent conductive material overlaps a portion of the lead wire; and a step (3C) of drying and curing the transparent conductive material under a condition enough to cause the coffee-ring phenomenon so as to form a transparent electrode and a pseudo auxiliary electrode which is disposed at an outer periphery of the transparent electrode and thicker than the transparent electrode.

(14) In the above (13), the process may further comprise: after the step (3A), a step (3A1) of forming a carbon layer to cover the portion of the lead wire; and after the step (3C), a step (3C2) of increasing a thickness of at least a portion of the pseudo auxiliary electrode, wherein, in the step (3C2), a layer comprising the same transparent conductive material is formed on at least a portion of the pseudo auxiliary electrode in accordance with a printing method.

Advantageous Effects of Invention

In accordance with the embodiments of the prevent invention, a transparent electrode capacitance sensor with an excellent reliability and material cost saved, which is excellent in designing properties, secures wide viewable area, and reduces the level difference between the transparent electrode and the auxiliary electrode to suppress bubbling and resultant parasitic capacitance, and a process for manufacturing the same transparent electrode capacitance sensor can be provided.

BRIEF DESCRIPTION OF DRAWINGS

FIG. 1A is a top view of a first embodiment of a transparent electrostatic capacitance sensor in accordance with the present invention.

FIG. 1B is a cross-sectional view of FIG. 1A along the line A-A.

FIG. 1C is an enlarged view of an encircled portion of FIG. 1B.

FIG. 2 is a diagram for explaining a coffee-ring (framing) phenomenon according to the first embodiment of the present invention.

FIG. 3A is a top view of the first embodiment of the transparent electrode capacitance sensor in accordance with the present invention.

FIG. 3B is a cross-sectional view of FIG. 3A along the line B-B.

FIG. 4A is a top view of the first embodiment of the transparent electrode capacitance sensor in accordance with the present invention.

FIG. 4B is a cross-sectional view of FIG. 4A along the line B-B.

FIG. 5 is a flow chart of a process for manufacturing the first embodiment of the transparent electrode capacitance sensor in accordance with the present invention.

FIG. 6 is a flow chart of a process for manufacturing a second embodiment of a transparent electrode capacitance sensor in accordance with the present invention.

FIG. 7 is a flow chart of a modified process for manufacturing the second embodiment of a transparent electrode capacitance sensor in accordance with the present invention.

FIG. 8A is a top view of a third embodiment of a transparent electrode capacitance sensor in accordance with the present invention.

FIG. 8B is a cross-sectional view of FIG. 8A along the line A-A.

FIG. 9 illustrates a diagram for explaining a coffee-ring (framing) phenomenon according to the third embodiment of the present invention.

FIG. 10A is a top view of the third embodiment of a transparent electrostatic capacitance sensor in accordance with the present invention.

FIG. 10B is a cross-sectional view of FIG. 10A along the line B-B.

FIG. 11A is a top view of the third embodiment of a transparent electrode capacitance sensor in accordance with the present invention.

FIG. 11B is a cross-sectional view of FIG. 11A along the line C-C.

FIG. 12 is a flow chart of a process for manufacturing the third embodiment of the transparent electrode capacitance sensor in accordance with the present invention.

FIG. 13 is a flow chart of a process for manufacturing the fourth embodiment of the transparent electrode capacitance sensor in accordance with the present invention.

FIG. 14 is a flow chart of a modified process for manufacturing the fourth embodiment of the transparent electrode capacitance sensor in accordance with the present invention.

FIG. 15A is a top view of a fifth embodiment of a transparent electrode capacitance sensor in accordance with the present invention.

FIG. 15B is a cross-sectional view of FIG. 15A along the line A-A.

FIG. 15C is an enlarged view of an encircled portion of FIG. 15B.

FIG. 16 illustrates a process for manufacturing the fifth embodiment in accordance with the present invention.

FIG. 17A is a top view of a fifth embodiment of a transparent electrode capacitance sensor in accordance with the present invention.

FIG. 17B is a cross-sectional view of FIG. 17A along the line B-B.

FIG. 18A is a top view of the embodiment of the transparent electrode capacitance sensor in accordance with the present invention.

FIG. 18B is a cross-sectional view of FIG. 18A along the line C-C.

FIG. 19A is a top view of the fifth embodiment of the transparent electrode capacitance sensor in accordance with the present invention.

FIG. 19B is a cross-sectional view of FIG. 19A along the line D-D.

FIG. 20A is a top view of the fifth embodiment of the transparent electrode capacitance sensor in accordance with the present invention.

FIG. 20B is a cross-sectional view of FIG. 20A along the line E-E.

FIG. 21A is a top view of the fifth embodiment of the transparent electrode capacitance sensor in accordance with the present invention.

FIG. 21B is a cross-sectional view of FIG. 21A along the line F-F.

FIG. 22 is a flow chart of a process for manufacturing the fifth embodiment of the transparent electrode capacitance sensor in accordance with the present invention.

DESCRIPTION OF EMBODIMENTS

With reference to the attached drawings, the embodiments of the present invention will be hereinafter described in detail.

First Embodiment

A first embodiment of a transparent electrode capacitance sensor in accordance with the present invention is hereinafter described. FIG. 1A is a top view of a first embodiment of a transparent electrode capacitance sensor in accordance with the present invention, FIG. 1B is a cross-sectional view of FIG. 1A along the line A-A, and FIG. 1C is an enlarged view of an encircled portion of FIG. 1B.

The embodiment of the transparent electrode capacitance sensor 1 has a transparent resin substrate 11, a transparent electrode 12a formed on one surface (i.e., single surface) of the transparent resin substrate 11, a pseudo auxiliary electrode 12b formed at the outer periphery of the transparent electrode 12a, a lead wire 13 connected to the pseudo auxiliary electrode 12b at its one end, and an adhesive layer 14 as a top surface as shown in FIG. 1B.

Referring to FIG. 1C, the pseudo auxiliary electrode 12b has a thickness greater than that of the transparent electrode 12a by a level difference $t_p$ (i.e., a step). In this regard, the pseudo auxiliary electrode 12b and the transparent electrode 12a contain the same material.

The transparent resin substrate 11 is formed of light transmitting, insulating material and is film, sheet, or plate-shaped. The material for the transparent resin substrate 11 can preferably employ a hard material such as a polyethylene terephthalate (PET), polycarbonate (PC) and acrylic resin, or an elastic material such as thermoplastic polyurethane, thermosetting polyurethane, and a silicone rubber.

More specifically, the material for the transparent resin substrate 11 can preferably employ resin material such as polyethylene naphthalate (PEN), polycarbonate (PC), polyethylene, polypropylene, polystyrene, polyvinyl chloride, polyvinyl alcohol, polybutylene terephthalate (PBT), polyvinylidene fluoride, polyacrylate, cycloolefin polymer (COP), and cycloolefin copolymer (COC). Among the above resin material, the material for the transparent resin substrate 11 can preferably employ polyethylene terephthalate (PET), and polycarbonate in terms of strength. Moreover, as the material for the transparent resin substrate 11 glass or transparent metallic oxide may be used. The thickness of the transparent resin substrate 11 is preferably from 10 μm to 200 μm. If the thickness of the 11 is 10 μm or above, rupture or breakage of the 11 hardly occurs. If the thickness of the 11 is 200 μm or below, the transparent electrode capacitance sensor 1 can be made thin.

The transparent electrode 12a is formed of a light transmitting, conductive material including ITO (indium tin oxide), FTO (F-doped tin oxide), transparent conductive polymer such as polythiophene, and polyaniline, or a polymer with a metallic (Ag, Cu, Ni, Au and etc.) nanowire dispersed therein, and formed as a rectangular shape on the transparent resin substrate 11 due to printing or application of the material. Furthermore, the shape of the transparent electrode itself is not limited to the afore-mentioned rectangular shape, and may be circular or oval. In this case, the transparent electrode 12a having the circular or oval shape may be formed on the transparent resin material 11 by printing or application of the material.

In a case where the conductive polymer is used, as the material for transparent electrode 12a polypyrrole, poly(N-methylpyrrole), poly(3-methylthiophene), poly(3-methoxythiophene), or poly(3,4-ethylenedioxythiophene) (PEDOT) may be preferably used. Since water-dispersible polythiophene derivatives using the polystyrene sulfonic acid (PSS) as water-soluble polymer (PEDOT/PSS) is water-soluble, it is preferred that the layer of the conductive polymer can be formed by a simple application process.

If the transparent electrode 12a is formed by the printing or application, the thickness of the conductive layer for defining the transparent electrode 12a is preferably from 0.05 μm to 5 μm, more preferably from 0.1 μm to 1 μm. If the thickness of the conductive layer is 0.05 μm or above, conductivity is preferably secured. If the thickness of the conductive layer is 0.1 μm or above, enough surface resistance of 600Ω/□ or below as a detection sensitivity can be stably secured. Furthermore, if the thickness of the conductive layer is 5 μm or below, the layer can be easily formed.

The lead wire 13 is formed of material with the electric resistance less than that of the transparent electrode 12a, and Ag paste is preferably used as the material for the lead wire 13. In this regard, the conventional art as mentioned in the background art uses the material having the electric resistance same as or similar to the material for the lead wire as the material for the auxiliary electrode in order to suppress the variation in the detection sensitivity, and employs the configuration that the auxiliary electrode is interposed between the lead wire and the transparent electrode.

As mentioned previously, in accordance with the conventional art, in order to suppress the variation in the detection sensitivity the material having the electric resistance same as or similar to the material for the lead wire is used as the material for the auxiliary electrode, and the auxiliary electrode is interposed between the lead wire and the transparent electrode. In terms of overall conditions such as resistance value and designing properties, the auxiliary electrode of silver is often used. In order to form the auxiliary electrode of silver the silver paste is used. The silver paste has high ratio of the silver particle and the solid content of the resin binder for high definition printing, and contains small amount of volatile component such as solvent. For the above reasons, the thickness is not largely varied before and after the printing. In the screen printing method using a screen printing plate in accordance with a general SUS mesh, a film thickness in a range of from 40 μm to 50 μm is generally provided. Even if the reduction in film thickness is considered, the film thickness is limited to ¼ to ⅕ of the range in terms of mass-productivity. The film thickness determines the thickness of the silver paste applied during the printing. As the silver paste contains small amount of the volatile component in the process of drying and etc., as described previously, it is hardly made thin. Furthermore, while it may be considered that thin ultra-high mesh and the like is used to reduce the film thickness of the auxiliary electrode, such ultra-high mesh, however, needs delicate handling. In view of the above, the conventional art has failed to sufficiently reduce the level difference between the transparent electrode and the auxiliary electrode in terms of mass-productivity.

On the other hand, in accordance with the present invention, a pseudo auxiliary electrode 12b is formed of the same material as the transparent electrode 12a; has a thickness greater than that of the transparent electrode 12a; and is interposed between the lead wire 13 and the transparent electrode 12a, thereby suppressing the variation in the detection sensitivity. In other words, as the transparent electrode 12a and the pseudo auxiliary electrode 12b are formed of the same material, the electric resistances of the transparent electrode 12a and the pseudo auxiliary electrode 12b are same in terms of composition of the material. However, as shown in FIG. 1C, as the thickness of the pseudo auxiliary electrode 12b is greater than that of the transparent electrode 12a by the level difference $t_p$ (i.e., the step), the electric resistance of the pseudo auxiliary electrode 12b portion is less than that of the transparent electrode 12a portion. However, as the level difference increases, there may be bubbling problem as well as transparency problem. That is even if the same material is used, the increase of the thickness may compromise the transparency, thereby leading to the reduction of design properties. In view of the above, the level difference $t_p$ is preferably 6 μm or below, more preferably 4 μm or below, and most preferably 3 μm or below. In this case, since the transparent electrode material is usually a material allowing for thin printing or application, even if the pseudo auxiliary electrode 12b portion is thicker than the transparent electrode 12a portion, it can be made sufficiently thin in comparison with the auxiliary electrode which is formed of the conventional silver paste and etc., thereby sufficiently reducing the level difference between the transparent electrode 12a and the pseudo auxiliary electrode 12b.

Adhesive layer 14 is a layer for protection and the like, and covers the transparent electrodes 12a, the pseudo auxiliary electrodes 12b, and the lead wires 13. Adhesive layer 14 is a light transmitting resin film with an adhesive agent on its one side, and due to the adhesive agent adheres to the transparent electrodes 12a, the pseudo auxiliary electrode 12b, and the lead wire 13. Furthermore, the adhesive layer 14 may be formed of, for example, a photosensitive dry film, an UV-curable resist material, or a heat-curable resist material.

A resin film that forms the adhesive layer 14 may be resin material such as polyethylene terephthalate (PET), polycarbonate (PC), acrylic resin, polyethylene naphthalate (PEN), polyethylene, polypropylene, polystyrene, polyvinyl chloride, polyvinyl alcohol, polybutylene terephthalate (PBT), polyvinylidene fluoride, and polyarylate. Furthermore, the adhesive layer 14 may include a film formed of glass or transparent metal oxide in place of the resin film, or in addition to the resin film. Specific examples of adhesive agent may be acrylic resin.

Compared to the conventional art, in accordance with the first embodiment of the present invention, the transparent electrode 12a and the pseudo auxiliary electrode 12b are formed of the same PEDOT/PSS. For the above reason, when the first embodiment of the transparent electrode capacitance sensor is used in a touch panel and the like, the pseudo auxiliary electrode 12b portion is less noticeable, which is advantageous in terms of design properties. Furthermore, as the level difference $t_p$ of FIG. 1C can be made 6 μm or below as mentioned previously in connection with the first embodiment of the present invention in accordance with a method which will be described below in detail, the bubbling problem during the application of the adhesive layer 14 can be avoided, thereby reducing parasitic capacitance. In addition, the material cost can be saved, compared to the case in which an expensive material such as silver is used.

In FIG. 1A, the pseudo auxiliary electrode 12b is formed over the entire outer periphery of the transparent electrodes 12a. However, when the transparent electrode capacitance sensor 1 of the embodiment of the present invention is applied to a touch panel and the like, it has been demonstrated that it would be enough that the length of the pseudo auxiliary electrode 12b, the thickness of which is greater than that of the transparent electrode 12a, is ½ or above of the length of outer periphery of the transparent electrode 12a. By reducing the area of the pseudo auxiliary electrode portion, a wide viewable area can be secured.

Next, a process for manufacturing the transparent electrode capacitance sensor in accordance with the first embodiment of the present invention will be described with reference to FIGS. 1A, 1B, 1C, 2 and 5. FIG. 5 is a flow chart of a process for manufacturing the first embodiment of the transparent electrode capacitance sensor in accordance with the present invention.

<Step 11 (S11)> (Also Referred to as "Step 1A")

The transparent electrode 12a formed of transparent conductive material such as PEDOT/PSS is formed on one surface of the substrate 11 formed of transparent polymer such as polyethylene terephthalate (PET) in accordance with ink-jet printing or screen printing.

<Step 12 (S12)> (Also Referred to as a "Step 1B")

The substrate 11 with the transparent electrode 12a on the one surface thereof, as obtained in Step 11 (S11) is subjected to low temperature drying process to cause the coffee-ring (i.e., framing) phenomenon in the transparent electrode 12a containing PEDOT/PSS and the like and to form the pseudo auxiliary electrode 12b having the thickness greater than that of the transparent electrode 12a by the level difference $t_p$ as shown in FIG. 1C at the outer periphery of the transparent electrode 12a. In this regard, the coffee-ring (i.e., framing) phenomenon will be described with reference to FIG. 2.

FIG. 2 is a diagram for explaining a coffee-ring (framing) phenomenon in connection with the first embodiment of the present invention. A coating material such as PEDOT/PSS is applied onto the one surface of the substrate 11 containing polyethylene terephthalate (PET) and the like in accordance with ink-jet printing or screen printing so as to form the transparent electrode 12a. Subsequently, the transparent electrode 12a is subjected to low temperature drying and curing at about 60° C. to move the coating material such as PEDOT/PSS toward the outer periphery thereof, thereby increasing the thickness of the outer periphery portion. This is a phenomenon called as a coffee-ring (flaming) and seen in the process of drying a liquid product. Then, drying and baking is performed at about 120° C. to complete the formation of the pseudo auxiliary electrode 12b portion at the outer periphery of the transparent electrode 12a. The pseudo auxiliary electrode 12b contains the same material as the transparent electrode 12, and has the thickness greater than that of the transparent electrode 12a.

According to the above-mentioned process, PEDOT/PSS is used in the transparent electrode 12a and the low temperature drying process causes the coffee-ring phenomenon, thereby allowing for the formation of the transparent electrode 12a and the pseudo auxiliary electrode 12b, the thickness of which is greater than that of the transparent electrode 12a by the enough small level difference. Specifically, the level difference $t_p$ as shown in FIG. 1C can be 6 μm or below, preferably 3 μm or below.

Furthermore, In Step 1B, after the formation of the pseudo auxiliary electrode 12b at the outer periphery of the transparent electrode 12a containing PEDOT/PSS and the like due to the coffee-ring (flaming) phenomenon, the same material such as PEDOT/PSS may be further applied to the pseudo auxiliary electrode 12b portion in accordance with ink-jet printing or screen printing to create the level difference $t_p$. This step can be referred to as "Step 1B2". Since even in this case, the majority of the material for the transparent electrode can be made thinner in comparison to the material for conventional auxiliary electrode, the pseudo auxiliary electrode 12b having the thickness greater than that of the transparent electrode 12a, with the suppressed level difference between the pseudo auxiliary electrode 12b and the transparent electrode 12a can be obtained. Even in this case, the level difference can be securely suppressed to 3 μm or below.

<Step 13 (S13)> (Also Referred to as "Step 1C")

As shown in FIG. 1A, the lead wire 13 containing Ag paste and the like is formed by the screen printing such that one end of the lead wire 13 overlaps the pseudo auxiliary electrode 12b.

<Step 14 (S14)>

As shown in FIGS. 1A and 1B, the adhesive layer 14 formed of transparent polymer such as polyethylene terephthalate (PET) is formed such that it covers the transparent resin substrate 11, the transparent electrodes 12a, the pseudo auxiliary electrode 12b and the lead wire 13.

In this case, after the transparent electrode 12a containing PEDOT/PSS and the like is formed on one surface of the substrate 11 containing PET and the like in Step 1 (S11), the product thus obtained is subjected to low temperature drying process to form the pseudo auxiliary electrode 12b in Step 2 (S12). Subsequently, the lead wire 13 is formed in Step 3 (S13). However, the lead wire 13 may be initially formed in the one surface of the substrate 11 containing PET and the like.

Second Embodiment

Next, a transparent electrode capacitance sensor in accordance with a second embodiment of the present invention is described. Since the geometrical configuration and the material for the transparent electrode capacitance sensor in accordance with the second embodiment of the present invention are equal or similar to those for the transparent electrode capacitance sensor in accordance with the first embodiment, description thereof is omitted. The transparent electrode capacitance sensor in accordance with the second embodiment has the geometrical configuration as shown in FIGS. 1A, 1B, and 1C.

The process for manufacturing the transparent electrode capacitance sensor in accordance with the second embodiment of the present invention will be described with reference to FIGS. 1A, 1B, 1C, and 6. FIG. 6 is a flow chart of a process for manufacturing the second embodiment of a transparent electrode capacitance sensor in accordance with the present invention.

<Step 21 (S21)>

In the process for manufacturing the transparent electrode capacitance sensor in accordance with the second embodiment of the present invention, the transparent electrode 12a formed of transparent conductive material such as PEDOT/PSS is formed on one surface of the substrate 11 containing polyethylene terephthalate (PET) and the like in accordance with ink-jet printing or screen printing.

<Step 22 (S22)>

The transparent conductive material such as PEDOT/PSS which is the same material as the transparent electrode 12a is applied to at least a portion of the outer periphery of the transparent electrodes 12a once or more (i.e., multiple times) in accordance with ink-jet printing or screen printing to form to form the pseudo auxiliary electrode 12b having the thickness greater than that of the transparent electrode 12a by the level difference $t_p$ as shown in FIG. 1C.

<Step 23 (S23)>

As shown in FIG. 1A, the lead wire 13 containing Ag paste and the like is formed by the screen printing such that one end of the lead wire 13 overlaps the pseudo auxiliary electrode 12b.

<Step 24 (S24)>

As shown in FIGS. 1A and 1B, the adhesive layer 14 formed of transparent polymer such as polyethylene terephthalate (PET) is formed such that it covers the transparent resin substrate 11, the transparent electrodes 12a, the pseudo auxiliary electrode 12b and the lead wire 13.

Next, a modified process for manufacturing the transparent electrode capacitance sensor in accordance with the second embodiment of the present invention will be described with reference to FIGS. 1A, 1B, 1C, and 7. FIG. 7 is a flow chart of a modified process for manufacturing the second embodiment of a transparent electrode capacitance sensor in accordance with the present invention.

<Step 211 (S211)>

In the modified process for manufacturing the transparent electrode capacitance sensor in accordance with the second embodiment of the present invention, PEDOT/PSS and the like is applied to at least a portion to be the pseudo auxiliary electrode 12b (i.e., a pseudo auxiliary electrode 12b-forming portion) of the one surface of the substrate 11 formed of transparent polymer containing polyethylene terephthalate (PET) and the like once or more (i.e., multiple times) in accordance with ink-jet printing or screen printing.

<Step 221 (S221)>

PEDOT/PSS and the like is applied to both of the portion of the pseudo auxiliary electrode 12b and the portion of the transparent electrode 12a once or more (i.e., multiple times) in accordance with ink-jet printing or screen printing. Due to the multiple application of PEDOT/PSS to the portion of pseudo auxiliary electrode 12b, the level difference $t_p$ as shown in FIG. 1C is created.

<Step 231 (S231)>

As shown in FIG. 1A, the lead wire 13 containing Ag paste and the like is formed by screen printing such that one end of the lead wire 13 overlaps the pseudo auxiliary electrode 12b.

<Step 241 (S241)>

As shown in FIGS. 1A and 1B, the adhesive layer 14 formed of transparent polymer such as polyethylene terephthalate (PET) is formed such that it covers the transparent resin substrate 11, the transparent electrodes 12a, the pseudo auxiliary electrode 12b and the lead wire 13.

Both of the process for manufacturing the transparent electrode capacitance sensor in accordance with the second embodiment of the present invention or the modified process thereof can secure the level difference (FIG. 1C) of 6 μm or below, preferably 3 μm or below.

Third Embodiment

Next, a transparent electrode capacitance sensor in accordance with a third embodiment of the present invention will be described. FIG. 8A is a top view of a third embodiment of a transparent electrode capacitance sensor in accordance with the present invention, and FIG. 8B is a cross-sectional view of FIG. 8A along the line A-A.

A transparent electrode capacitance sensor 1 has a transparent resin substrate 11, a transparent electrode 12a formed on one surface of the transparent resin substrate 11, a pseudo auxiliary electrode 12b formed at the outer periphery of the transparent electrode 12a, a lead wire 13 connected to the pseudo auxiliary electrode 12b at its one end and interposed between the pseudo auxiliary electrode 12b and the transparent resin substrate 11, and an adhesive layer 14 as a top surface as shown in FIG. 8B. The properties, material, preferred thickness and etc. of the transparent resin substrate 11 and the transparent electrode 12a of third embodiment are the same as those of the first embodiment.

The lead wires 13 is formed of metal vapor deposition film containing Cu, Al, Ni, or Au, or alloy thereof having an electric resistance lower than that of the transparent electrode 12a. Furthermore, a laminated structure of the aforementioned metal, such as a laminated structure of Cu as a base layer, Ni as an intermediate layer formed on the base, and Au as a coating layer formed on the intermediate layer may be adopted. The thickness of the lead wire 13 is from 0.1 µm to 3 µm, preferably 0.1 µm to 1 µm, more preferably 0.1 µm to 0.5 µm. If the thickness of the lead wire 13 is 0.1 µm or above, the resistance value of the transparent electrode 12a is not attenuated, and stable conductivity can be secured. If the thickness of the lead wire 13 is 3 µm or below, sufficient small amount of level difference between the transparent electrode 12a and the lead wire 13 can be secured. The level difference between the lead wire 13 and the transparent electrode 12a is further reduced if the thickness of the lead wire 13 is less than 1 µm, preferably 0.05 µm.

The third embodiment is equal to the first embodiment in that the pseudo auxiliary electrode 12b is interposed between the lead wire 13b and the transparent electrode 12a; is formed of the same material as the transparent electrode 12a; and has the thickness greater than the that of the transparent electrode 12a, thereby suppressing variation in detection sensitivity. The third embodiment is equal to the first embodiment in the properties and material of the adhesive layer 14.

Compared to the conventional art, in accordance with the third embodiment of the present invention, the transparent electrode 12a and the pseudo auxiliary electrode 12b are formed of the same PEDOT/PSS. For the above reason, when the third embodiment of the transparent electrode capacitance sensor is used in a touch panel and the like, the pseudo auxiliary electrode 12b portion is less noticeable, which is advantageous in terms of design properties. Furthermore, as described above, since the material used for the transparent electrode can be made thin, the pseudo auxiliary electrode 12b can be made thin accordingly.

Furthermore, as shown in FIG. 8B, the lead wire 13 and the pseudo auxiliary electrode 12b overlap at a connection. In this regard, the lead wire 13 is not formed using Ag paste as used in the conventional art, and formed using metal (e.g., Cu) vapor deposition film to result in very thin lead wire 13 whose thickness is from 0.1 µm to 3 µm. Accordingly, due to the thickness of the lead wire 13, less level difference is created at the connection where the lead wire 13 and the pseudo auxiliary electrode 12b, in comparison with the portion of the pseudo auxiliary electrode 12b other than the connection. As a result, the level difference $t_p$ (see FIG. 8B) of the pseudo auxiliary electrode 12b including the connection can be reduced to 6 or below and the bubbling problem occurring due to the level difference during the formation of the adhesive layer 14 can be avoided, thereby reducing the parasitic capacitance. In addition, cost for material can be saved in comparison with the conventional art where expensive material such as silver is used.

In FIG. 8A, the pseudo auxiliary electrode 12b is formed over the entire outer periphery of the transparent electrodes 12a. However, when the transparent electrode capacitance sensor 1 in accordance with the embodiment of the present invention is applied to a touch panel and the like, it has been demonstrated that it would be enough that the length of the pseudo auxiliary electrode 12b, the thickness of which is greater than that of the transparent electrode 12a, is ⅕ or above of the length of outer periphery of the transparent electrode 12a. By reducing the area of the pseudo auxiliary electrode portion, a wide viewable area can be secured.

Next, a process for manufacturing the transparent electrode capacitance sensor in accordance with the third embodiment of the present invention will be described with reference to FIGS. 8A, 8B, 9, and 12. FIG. 12 is a flow chart of a process for manufacturing the third embodiment of the transparent electrode capacitance sensor in accordance with the present invention.

<Step 31 (S31)> (Also Referred to as "Step 3A")

A transparent resin substrate film with metal vapor deposition film is provided by depositing a metal such as Cu, Al, Ag, Au and etc. at a thickness of 0.1 µm to 3 µm on an entire one surface of the transparent resin substrate 11 formed of transparent polymer such as polyethylene terephthalate (PET) in accordance with vapor deposition method such as vacuum vapor deposition. The transparent resin substrate film thus obtained is subjected to etching such as dry etching or wet etching to partially remove the metal vapor deposition film to form the lead wire 13.

<Step 32 (S32)> (Also Referred to as "Step 3B")

The transparent electrode 12a formed of the transparent conductive material such as PEDOT/PSS is formed on the surface of the transparent resin substrate 11 at the side of the lead wire 13 which is formed in Step 31 (S31) in accordance with ink-jet printing or screen printing such that it covers an end (a portion) of the lead wire 13.

<Step 33 (S33)> (Also Referred to as "Step 3C")

The transparent resin substrate 11 with the transparent electrode 12a and the lead wire 13 on its single surface is subjected to low temperature drying process to cause the coffee-ring (framing) phenomenon in the transparent electrode 12a containing PEDOT/PSS and the like and to form the pseudo auxiliary electrode 12b having the thickness greater than that of the transparent electrode 12a by the level difference $t_p$ as shown in FIG. 8B at the outer periphery of the transparent electrode 12a. Here, the coffee-ring (framing) phenomenon will be described with reference to FIG. 9.

FIG. 9 is a diagram for explaining a coffee-ring (framing) phenomenon according to the third embodiment of the present invention. A coating material such as PEDOT/PSS is applied on the one surface of the substrate 11 disposed on a jig plate 15 and containing polyethylene terephthalate (PET) and the like in accordance with ink jet printing or screen printing to form the transparent electrode 12a, and the product thus obtained is then subjected to low temperature drying and curing under the drying temperature of about 60° C. to move the coating material such as PEDOT/PSS toward the outer periphery thereof, thereby increasing the thickness of the outer periphery. This is a phenomenon called as a coffee-ring (flaming) and seen in the process of drying a liquid product. Subsequently, drying and baking is performed at about 120° C. to complete the formation of the pseudo auxiliary electrode 12b portion at the outer periphery of the transparent electrode 12a. The pseudo auxiliary electrode 12b contains the same material as the transparent electrode 12a and has the thickness greater than that of the transparent electrode 12a.

According to the above-mentioned process, PEDOT/PSS is used in the transparent electrode 12a and the low temperature drying process creates the coffee-ring phenomenon, thereby allowing for the formation of the transparent electrode 12a and the pseudo auxiliary electrode 12b, the thickness of which is greater than that of the transparent electrode 12a by the enough small amount of level difference. Specifically, the level difference $t_p$ as shown in FIG. 8B can be 6 μm or below, preferably 3 μm or below.

Once forming the pseudo auxiliary electrode 12b at the outer periphery of the transparent electrode 12a containing PEDOT/PSS and the like due to the coffee-ring (flaming) phenomenon, the end (i.e., a portion) of the lead wire 13 with the metal vapor deposition film of 0.1 μm to 0.3 μm in thickness is interposed between the pseudo auxiliary electrode 12b and the transparent resin substrate 11.

After the formation of the pseudo auxiliary electrode 12b at the outer periphery of the transparent electrode 12a containing PEDOT/PSS and the like due to the coffee-ring (flaming) phenomenon in Step 3C, the same material such as PEDOT/PSS may be further applied to the pseudo auxiliary electrode 12b portion in accordance with ink jet printing or screen printing to create the level difference $t_p$. This step can be referred to as "Step 3C2". Since even in this case, the majority of the material for the transparent electrode can be made thinner in comparison to the material for conventional auxiliary electrode, the pseudo auxiliary electrode 12b having the thickness greater than that of the transparent electrode 12a, with the suppressed level difference between the pseudo auxiliary electrode 12b and the transparent electrode 12a can be obtained. In this case, the level difference can be securely reduced to 3 μm or below.

<Step 34 (S34)>

As shown in FIGS. 8A and 8B, the adhesive layer 14 formed of transparent polymer such as polyethylene terephthalate (PET) is applied such that it covers the transparent resin substrate 11, the transparent electrodes 12a, the pseudo auxiliary electrode 12b and the lead wire 13.

In accordance with the arrangement as shown in FIG. 8B, the pseudo auxiliary electrode 12b containing PEDOT/PSS and the like is in direct contact with and covers the end of the lead wire 13 which is formed on the transparent resin substrate 11. Since the solvent of the transparent conductive coating material is acidic, there is a possibility that the end (i.e., a portion) of the lead wire 13 with the metal vapor deposition film is oxidized. In this regard, after the step 3A, as shown in FIGS. 10A and 10B, a carbon layer 23a may be formed between an end (i.e., a portion) of the lead wire 23b and the pseudo auxiliary electrode 22b in accordance with printing method and the like (also referred to as "Step 3A2") to prevent a direct contact between the end (i.e., a portion) of the lead wire 23b and the pseudo auxiliary electrode 22b. As such, the oxidation of the end of the lead wire 23b can be avoided to increase the reliability of the connection.

Fourth Embodiment

Next, a transparent electrode capacitance sensor in accordance with a fourth embodiment of the present invention is described. Since the configuration and material of the transparent electrode capacitance sensor in accordance with the fourth embodiment of the present invention are identical to those of the transparent electrode capacitance sensor in accordance with the third embodiment of the present invention which is described with reference to FIGS. 8A and 8B, the same description thereof is omitted. Since the transparent electrode capacitance sensor in accordance with the fourth embodiment is mainly different from the transparent electrode capacitance sensor in accordance with the third embodiment in terms of the process for manufacturing the transparent electrode capacitance sensor, the process for manufacturing the transparent electrode capacitance sensor in accordance with the fourth embodiment will be mainly described.

The process for manufacturing the transparent electrode capacitance sensor in accordance with the fourth embodiment of the present invention will be described with reference to FIGS. 8A, 8B, and 13. FIG. 13 is a flow chart of a process for manufacturing the fourth embodiment of the transparent electrode capacitance sensor in accordance with the present invention.

<Step 41 (S41)>

A transparent substrate film with a metal vapor deposition film is provided by vapor deposition, for example, vacuum vapor deposition, of a metal such as Cu, Al, Ag, Au and etc. at a thickness of 0.1 μm to 3 μm on an entire one surface of the transparent resin substrate 11 formed of transparent polymer such as polyethylene terephthalate (PET). The transparent substrate film with the metal vapor deposition film thus obtained is subjected to etching such as dry etching or wet etching to partially remove the metal vapor deposition film to form the lead wire 13.

<Step 42 (S42)>

The transparent electrode 12a formed of the transparent conductive material such as PEDOT/PSS is formed on the surface of the transparent resin substrate 11 at the side of the lead wire 13 which is formed in Step 41 (S41) in accordance with ink jet printing or screen printing such that it covers an end (i.e., a portion) of the lead wire 13.

<Step 43 (S43)>

The transparent conductive material such as PEDOT/PSS which is the same material as the transparent electrode 12a is applied to at least a portion of the outer periphery of the transparent electrodes 12a once or more (i.e., multiple times) in accordance with ink-jet printing or screen printing to form the pseudo auxiliary electrode 12b having the thickness greater than that of the transparent electrode 12a by the level difference $t_p$ as shown in FIG. 8B.

<Step 44 (S44)>

As shown in FIGS. 8A and 8B, the adhesive layer 14 formed of transparent polymer such as polyethylene terephthalate (PET) is formed such that it covers the transparent resin substrate 11, the transparent electrodes 12a, the pseudo auxiliary electrode 12b and the lead wire 13.

Next, a modified process for manufacturing the transparent electrode capacitance sensor in accordance with the fourth embodiment of the present invention will be described with reference to FIGS. 8A, 8B and 14. FIG. 14 is a flow chart of a modified process for manufacturing the fourth embodiment of the transparent electrode capacitance sensor in accordance with the present invention.

<Step 411 (S411)>

A transparent substrate film with metal vapor deposition film is provided by vapor deposition, for example, the vacuum vapor deposition, of a metal such as Cu, Al, Ag, Au and etc. at a thickness of 0.1 μm to 3 μm on an entire one surface of the transparent resin substrate 11 formed of transparent polymer such as polyethylene terephthalate (PET). The transparent substrate film with metal vapor deposition film thus obtained is subjected to etching such as dry etching or wet etching to partially remove the metal vapor deposition film to form the lead wire 13.

<Step 421 (S421)>

PEDOT/PSS and the like is applied to a portion to be the pseudo auxiliary electrode 12b (i.e., a pseudo auxiliary electrode 12b-forming portion) on one surface of the substrate 11 containing PET and the like once or more (i.e., multiple times) in accordance with ink-jet printing or screen printing.

<Step 431 (S431)>

PEDOT/PSS and the like is applied to both of the portion of the pseudo auxiliary electrode 12b and the portion of the transparent electrode 12a once or more (i.e., multiple times) in accordance with ink-jet printing or screen printing. Due to the multiple application of PEDOT/PSS onto the portion of pseudo auxiliary electrode 12b, the level difference $t_p$ as shown in FIG. 8B is created.

<Step 441 (S441)>

As shown in FIGS. 8A and 8B, the adhesive layer 14 formed of transparent polymer such as polyethylene terephthalate (PET) is applied such that it covers the transparent resin substrate 11, the transparent electrodes 12a, the pseudo auxiliary electrode 12b and the lead wire 13.

Both of the process for manufacturing the transparent electrode capacitance sensor in accordance with the fourth embodiment of the present invention or the modified process thereof can secure the level difference of 6 μm or below, preferably 3 μm or below. Furthermore, even in the process for manufacturing the transparent electrode capacitance sensor in accordance with the fourth embodiment of the present invention, the carbon layer is formed in the portion of the lead wire 13 where the pseudo auxiliary electrode 12b is disposed to prevent the oxidation of the lead wire 13, thereby increasing the reliability of the connection.

Fifth Embodiment

Next, a transparent electrode capacitance sensor in accordance with a fifth embodiment of the present invention is described. FIG. 15A is a top view of a fifth embodiment of a transparent electrode capacitance sensor in accordance with the present invention; FIG. 15B is a cross-sectional view of FIG. 15A along the line A-A; and FIG. 15C is an enlarged view of an encircled portion of FIG. 15B.

The transparent electrode capacitance sensor 1 has a transparent resin substrate 11, a transparent electrode 12a formed on one surface of the transparent resin substrate 11, a pseudo auxiliary electrode 12b formed at an outer periphery of the transparent electrode 12a, a lead wire 13 with an end thereof connected to the transparent electrode 12a in a notch portion 12c, and an adhesive layer 14 as a top surface as shown in FIG. 15B. The transparent electrode 12a and the pseudo auxiliary electrode 12b are formed of the same material. The properties, material and preferred thickness of the transparent resin substrate 11 and the transparent electrode 12a are equal to those of the first embodiment.

In the fifth embodiment, in order to avoid direct contact between the lead wire 13 and the pseudo auxiliary electrode 12b, the notch portion 12c is provided in a portion of the pseudo auxiliary electrodes 12b. The lead wire 13 is connected to the transparent electrode 12a at the notch portion 12c.

The distance between the lead wire 13 and the pseudo auxiliary electrode 12b in the connection between the lead wire 13 and the transparent electrode 12a at the notch portion 12c is preferably once to ten times, preferably twice to five times, greater than the thickness of the lead wire 13 in the plan view as shown in FIG. 15A. If the distance between the lead wire 13 and the pseudo auxiliary electrode 12b is less than the thickness of the lead wire 13, bubbling may occur. On the other hand, if the distance between the lead wire 13 and the pseudo auxiliary electrode 12b is beyond ten times greater than the thickness of the lead wire 13, the effect of the pseudo auxiliary electrode 12b may be reduced.

Referring to FIG. 15C, the lead wire 13 is connected to an end of the transparent electrode 12a, and the thickness of the connection is greater than that of the transparent electrode 12a by the level difference $t_p$.

The lead wire 13 is formed of material with an electric resistance lower than the transparent electrode 12a. For example, the lead wire 13 may be formed using Ag paste. Furthermore, the lead wire 13 may be formed by metallic film including Cu, Al, Ni, or Au, or alloy thereof, or have a laminated structure of the afore-mentioned metal, such as a laminated structure of Cu as a base, Ni as an intermediate layer formed on the base, and Au as a coating layer formed on the intermediate layer. If the lead wire 13 is a metallic film, the thickness of the lead wire 13 is from 0.1 μm to 3 μm, preferably 0.1 μm to 1 μm, more preferably 0.1 μm to 0.5 μm. If the thickness of the lead wire 13 is 0.1 μm or above, the resistance value of the transparent electrode 12a is not attenuated, and stable conductivity can be thus secured. If the thickness of the lead wire 13 is 3 μm or below, sufficient small amount of level difference can be secured between the transparent electrode 12a and the lead wire 13. The level difference is further reduced if the thickness of the lead wire 13 is 1 μm or below, preferably 0.05 μm or below. As such, the lead wire 13 is preferably metallic film in terms of conductivity and reduction in level difference. In this regard, in accordance the conventional art, the auxiliary electrode is formed of the material, the resistance of which is equal or similar to material for the lead wire to suppress the variation in the detection sensitivity, and is interposed between the lead wire and the transparent electrode.

In terms of overall condition such as resistance value and designing properties, the auxiliary electrode of silver is conventionally used, and the silver paste is conventionally used so as to form the auxiliary electrode of silver. The silver paste has high ratio of silver particle and solid content of the resin binder is high for high definition printing, and contains small amount of volatile component such as solvent. For the above reason, the thickness is not largely varied before and after the printing. In the screen printing method using a screen printing plate in accordance with a general SUS mesh, a film thickness in a range of from 20 μm to 50 μm is generally provided. Even if reduction of the film thickness is considered, the film thickness is limited to ¼ to ⅕ of the above range in terms of mass-productivity. The film thickness determines the thickness of the silver paste applied during the printing. As the silver paste contains small amount of the volatile component in the process of drying and etc., as described previously, quite thin thickness is hardly attained. Furthermore, while it may be considered that thin ultra-high mesh and the like is used to reduce the film thickness of the auxiliary electrode, such ultra-high mesh, however, needs delicate handling. In view of the above, the conventional art has failed to provide sufficiently reduced level difference between the transparent electrode and the auxiliary electrode in terms of mass-productivity.

On the other hand, in accordance with the embodiments of the present invention, the pseudo auxiliary electrode 12b which is formed of the same material as the transparent electrode 12a and has a thickness greater than that of the transparent electrode 12a is formed at the periphery of the transparent electrode 12a to suppress the variation in the detection sensitivity. In other words, since the transparent electrode 12a and the pseudo auxiliary electrode 12b are formed of the same material, the electric resistance of the transparent electrode 12a is equal to that of the pseudo auxiliary electrode 12b in terms of composition of the material. However, since the thickness of the pseudo auxiliary electrode 12b is greater than that of the transparent electrode 12a, the electric resistance of the pseudo auxiliary electrode 12b portion is less than that of the transparent electrode 12a portion. However, as the thickness of the pseudo auxiliary electrode 12b increases, the level difference between the pseudo auxiliary electrode 12b and the transparent electrode 12a increases. As a result, the bubbling problem may occur. In addition, even if the same material used for the transparent electrode 12a and the pseudo auxiliary electrode 12b, the increase in the thickness may lead to reduction in transparency, and resultant reduction of design properties. In view of the above, the level difference $t_p$ between the transparent electrode 12a and the pseudo auxiliary electrode 12b is preferably 6 µm or below, more preferably 4 µm or below, and most preferably 3 µm or below. In this regard, since the transparent electrode material is a material capable of performing thin printing or coating, even if the pseudo auxiliary electrode 12b portion is thicker than the transparent electrode 12a portion, enough thin pseudo auxiliary electrode can be obtained in comparison with the auxiliary electrode which is formed of conventional silver paste and etc., thereby sufficiently reducing the level difference between the transparent electrode 12a and the pseudo auxiliary electrode 12b. Accordingly, the level difference where bubbling may occur is $t_p$ of FIG. 15C, and the portion where the level difference is created is limited to a narrow area of the connection between the lead wire 13 and the transparent electrode 12a, as shown in FIG. 15A.

On the other hand, in a case where the lead wire 13 is formed of metallic film, the lead wire 13 can be formed by vapor deposition of metal on the transparent resin substrate 11, and then the transparent electrode 12a and the pseudo auxiliary electrode 12b are formed. In this case, a carbon layer can be preferably formed on the lead wire 13 such that the lead wire 13 is not in direct contact with the transparent electrode 12a containing PEDOT/PSS, and the transparent electrode 12a is formed on the carbon layer. Since a solution of a transparent electrode material such as PEDOT/PSS is acidic, the lead wire 13 may be oxidized by the transparent electrode material which is applied onto the lead wire 13 to come in direct contact with the lead wire 13. In this regard, the carbon layer can be formed on the lead wire 13 by the printing method and the like, and the transparent electrode 12a can be formed on the carbon layer so as to avoid the oxidation of the lead wire 13 as mentioned above. For the above reason, the carbon layer can be interposed between the lead wire 13 and the transparent electrode 12a to improve the reliability of the connection (i.e., the state of connection). The properties and the material for the adhesive layer 14 are the same as used in the first embodiment.

Compared to the conventional art, in accordance with the fifth embodiment of the present invention, the transparent electrode 12a and the pseudo auxiliary electrode 12b are formed using the same material, PEDOT/PSS. For the above reasons, when the fifth embodiment of the transparent electrode capacitance sensor is used in a touch panel and the like, the pseudo auxiliary electrode 12b portion is less noticeable, which is advantageous in terms of design properties. Furthermore, due to a method which is described below in detail the level difference $t_p$ is made 6 µm or below as mentioned previously in the fifth embodiment of the present invention, and the portion where the level difference is created and the bubbling may occur is thus limited to the narrow area, the connection between the lead wire 13 and the transparent electrode 12a as shown in FIG. 15A. Accordingly, the bubbling problem during the covering of the adhesive layer 14 can be avoided, thereby reducing parasitic capacitance. In addition, the material cost can be saved, compared to the case in which expensive material such as silver is used.

In FIG. 15A, the pseudo auxiliary electrode 12b is formed over the substantially entire outer periphery of the transparent electrodes 12a except for a portion thereof. However, in a case where the transparent electrode capacitance sensor 1 of the embodiment of the present invention is applied to a touch panel and the like, it has been demonstrated that it would be enough that the length of the pseudo auxiliary electrode 12b, the thickness of which is greater than that of the transparent electrode 12a, is 1/7 or above of outer periphery (i.e., the length of the outer periphery) of the transparent electrode 12a. By reducing the area of the pseudo auxiliary electrode portion, a wider viewable area can be secured.

Next, a process for manufacturing the transparent electrode capacitance sensor in accordance with the fifth embodiment of the present invention will be described with reference to FIGS. 15A, 15B, 15C, 16, and 22. FIG. 22 is a flow chart of a process for manufacturing the fifth embodiment of the transparent electrode capacitance sensor in accordance with the present invention.

<Step 51 (S51)>

The transparent conductive material such as PEDOT/PSS is applied onto one surface of the transparent resin substrate 11 formed of transparent polymer such as polyethylene terephthalate (PET) in a predetermined pattern in accordance with printing method to form a transparent electrode 12a.

As the printing method, a general printing method such as ink-jet printing, screen printing, PAD printing, and flexographic printing can be employed. Among them, ink jet printing is preferred because of the high flexibility of coating pattern to be formed. Furthermore, in order to form a predetermined pattern, the transparent electrode material may be applied in a predetermined pattern, or after the application of the transparent electrode material patterning may be carried out by dry etching and the like such that the predetermined pattern is obtained.

<Step 52 (S52)>

The same transparent electrode material (PEDOT/PSS and the like) as used in Step 1 is applied onto the outer periphery of the transparent electrode 12a obtained in Step S51 (S51) in accordance with the printing method such that a notch portion 12c as shown in FIG. 16 is formed. As a result, the pseudo auxiliary electrode 12b is formed. As such, since the transparent electrode material is applied onto the pseudo auxiliary electrode 12b portion in multiple times, the thickness of the pseudo auxiliary electrode 12b become greater than that of the transparent electrode 12a.

Since the pseudo auxiliary electrode 12b which is obtained by multiple application of the transparent electrode material on the transparent electrode 12a has a thickness greater than the that of the transparent electrode 12a, there is created a level difference between the transparent electrode 12a and the pseudo auxiliary electrode 12b. However, since the transparent electrode material can be applied in a manner much thinner than the conventional silver paste, as described previously, the level difference between the pseudo auxiliary electrode 12b thus obtained and the transparent electrode 12a can be reduced. Accordingly, the bubbling can be suppressed in the portion of level difference during the formation of the adhesive layer 14, thereby reducing the parasitic capacitance accompanied by the bubbling. As a result, the decrease in the sensitivity of the transparent electrode capacitance sensor can be avoided. The level difference between the pseudo auxiliary electrode 12b and the transparent electrode 12a can be 6 μm or below, preferably 3 μm or below.

Furthermore, while the transparent electrode material is applied once in Step 1 and Step 2 respectively, the number (times) of application is not limited thereto. In other words, the transparent electrode material may be applied in multiple times (i.e., twice or more) for the formation of the transparent electrode 12 and the transparent electrode material may be applied in multiple times (i.e., twice or more) for the formation of the pseudo auxiliary electrode 12b.

In order to obtain the predetermined state, the application of the transparent electrode material in multiple times is better than the application of the transparent electrode material once in terms of easiness of controlling the thickness of the transparent electrode 12a and the pseudo auxiliary electrode 12b. On the other hand, as the number (times) of the application increases, labor or effort increases accordingly. Therefore, the number (times) of the application of the transparent electrode material for the formation of the transparent electrode 12a or the pseudo auxiliary electrode 12b can be properly determined by considering the easiness of minute control (e.g., the control of the thickness) and the increase in the effort to be taken therefore.

<Step 53 (S53)>

As shown in FIG. 15A, the lead wire 13 containing Ag paste and the like is formed using the screen printing such that it overlaps the transparent electrode 12a at the notch portion 12c. The thickness of the lead wire containing Ag paste is 5 μm to 20 μm.

<Step 54 (S54)>

As shown in FIGS. 15A and 15B, the adhesive layer 14 formed of transparent polymer such as polyethylene terephthalate (PET) is applied such that it covers the transparent resin substrate 11, the transparent electrodes 12a, the pseudo auxiliary electrode 12b and the lead wire 13.

While the lead wire 13 is formed after the formation of the transparent electrode 12a and the pseudo auxiliary electrode 12b, it may be formed on the transparent resin substrate 11 in advance. For example, the metallic film may be formed on the transparent resin substrate 11 by the metal vapor deposition, dry etching may be then performed to form a predetermined lead wire 13, and the transparent electrode material may be then applied such that Step 1 (i.e., the formation of the transparent electrode 12a) and Step 2 (i.e., the formation of the pseudo auxiliary electrode 12b) are performed. In this case, in order to avoid the oxidation of the lead wire 13, the portion of the lead wire 13 on which the transparent electrode material is to be applied is preferably provided with the carbon layer by printing method such that the transparent electrode material is not in direct contact with the lead wire 13.

EXAMPLES

Firstly, Examples 1-5 with respect to the first and second embodiments as described previously are hereinafter described.

Example 1

As shown in FIGS. 1A, 1B, and 1C, PEDOT/PSS was used to form the transparent electrode 12a and the pseudo auxiliary electrode 12b on the polyethylene terephthalate (PET) substrate 11, and the lead wire 13 of Ag paste was then formed.

A solution of PEDOT/PSS having a viscosity of about $10C_p$ was applied onto a PET film having a thickness of 50 μm in a predetermined pattern using an ink-jet apparatus so as to form the transparent electrode 12a. After the product thus obtained was slowly dried on a hot plate of about 60° C., it was baked at the temperature of 120° C. for a period of 5 minutes to cause a coffee-ring (framing) phenomenon, thereby forming the PEDOT/PSS pseudo auxiliary electrode 12b at the outer periphery of the transparent electrode 12a. Subsequently, the lead wire 13 was formed using Ag paste having an electric resistance lower than that of the transparent electrode 12a such that it overlapped a portion of the pseudo auxiliary electrode 12b, and the adhesive layer 14 was then formed over the entire surface of the substrate 11 including the transparent electrode 12a, the pseudo auxiliary electrode 12b and the lead wire 13. As such, the transparent electrode capacitance sensor 1 was obtained.

Example 2

As shown in FIGS. 1A, 1B, and 1C, PEDOT/PSS was used to form the transparent electrode 12a and the pseudo auxiliary electrode 12b on the polyethylene naphthalate (PEN) substrate 11 and the lead wire 13 of Ag paste was then formed.

A solution of PEDOT/PSS having a viscosity of about $10C_p$ was applied onto a PET film having a thickness of 75 μm in a predetermined pattern using an ink jet apparatus so as to form the transparent electrode 12a. After the product thus obtained was slowly dried on a hot plate of about 60° C., it was baked at the temperature of 120° C. for a period of 5 minutes to cause a coffee-ring (framing) phenomenon, thereby forming the PEDOT/PSS pseudo auxiliary electrode 12b at the outer periphery of the transparent electrode 12a. Subsequently, the lead wire 13 was formed using Ag paste having an electric resistance lower than that of the transparent electrode 12a such that it overlapped a portion of the pseudo auxiliary electrode 12b, and the adhesive layer 14 was then formed over the entire surface of the substrate 11 including the transparent electrode 12a, the pseudo auxiliary electrode 12b and the lead wire 13. As such, the transparent electrode capacitance sensor 1 was obtained.

Example 3

As shown in FIGS. 1A, 1B, and 1C, PEDOT/PSS was used to form the transparent electrode 12a and the pseudo auxiliary electrode 12b on the polycarbonate (PC) substrate 11 and the lead wire 13 of Ag paste was then formed.

A solution of PEDOT/PSS having a viscosity of about $10C_p$ was applied onto a PC film having a thickness of 100 μm in a predetermined pattern using an ink jet apparatus so as to form the transparent electrode 12a. After the product thus obtained was slowly dried on a hot plate of about 60° C., it was baked at the temperature of 120° C. for a period of 5 minutes to cause a coffee-ring (framing) phenomenon, thereby forming the PEDOT/PSS pseudo auxiliary electrode 12b at the outer periphery of the transparent electrode 12a. Subsequently, the lead wire 13 was formed using Ag paste having an electric resistance lower than that of the transparent electrode 12a such that it overlapped a portion of the pseudo auxiliary electrode 12b, and the adhesive layer 14 was then formed over the entire surface of the substrate 11 including the transparent electrode 12a, the pseudo auxiliary electrode 12b and the lead wire 13. As such, the transparent electrode capacitance sensor 1 was obtained.

Example 4

As shown in FIGS. 3A and 3B, the lead wire 23 of Ag paste was formed on the polyethylene terephthalate (PET) substrate 21, and PEDOT/PSS was then used to form the transparent electrode 22a and the pseudo auxiliary electrode 22b.

Ag paste was used to form the lead wire 23 on a PET film having a thickness of 50 μm by the screen printing, and a solution of PEDOT/PSS having a viscosity of about $10C_p$ was applied in a predetermined pattern by an ink-jet apparatus such that it overlapped 1 mm of the end of the lead wire 23. As such, the transparent electrode 22a was formed. After the product thus obtained was slowly dried on a hot plate of about 60° C., it was baked at the temperature of 120° C. for a period of 5 minutes to cause a coffee-ring (framing) phenomenon, thereby forming the PEDOT/PSS pseudo auxiliary electrode 22b at the outer periphery of the transparent electrode 22a. The adhesive layer 24 was then formed over the entire surface of the substrate 21 including the transparent electrode 22a, the pseudo auxiliary electrode 22b and the lead wire 23. As such, the transparent electrode capacitance sensor 2 was obtained. The thickness of the transparent electrode 22a was about 0.2 μm and the thickness of the pseudo auxiliary electrode 22b is about 1.0 μm.

Example 5

As shown in FIGS. 4A and 4B, the lead wire 33b of Ag paste was formed on the polyethylene terephthalate (PET) transparent resin substrate 31, and after the formation of the carbon printing 33a at the end of the lead wire 33b, PEDOT/PSS was used to form the transparent electrode 32a and the pseudo auxiliary electrode 32b.

Ag paste was used to form the lead wire 33b on a PET film having a thickness of 50 μm by the screen printing, and the carbon printing 33a was performed in 2 mm of the end of the lead wire 33b in accordance with PAD printing. A solution of PEDOT/PSS having a viscosity of about $10C_p$ was applied onto the carbon printing 33a in a predetermined pattern by an ink-jet apparatus such that it overlapped 1 mm of the end of the carbon printing 33a. As such, the transparent electrode 32a was formed. The surface resistance of the carbon printing portion was about 100Ω/□. After the product thus obtained was slowly dried on a hot plate of about 60° C., it was baked at the temperature of 120° C. for a period of 5 minutes to cause a coffee-ring (framing) phenomenon, thereby forming the PEDOT/PSS pseudo auxiliary electrode 32b at the outer periphery of the transparent electrode 32a. The adhesive layer 34 was then formed over the entire surface of the substrate 31 including the transparent electrode 32a, the pseudo auxiliary electrode 32b and the lead wire 33b. As such, the transparent electrode capacitance sensor 3 was obtained. The thickness of the transparent electrode 32a was about 0.2 μm and the thickness of the pseudo auxiliary electrode 32b is about 1.0 μm.

Examples 1-5 have proved that the following effects are obtained: (A) Compared to the conventional auxiliary electrode which is formed of Ag paste and the like, Examples 1, 2 and 4 can produces thin, light transmitting pseudo auxiliary electrode, thereby reducing the level difference between the transparent electrode and the auxiliary electrode, suppressing the bubbling during the formation of the adhesive layer, and reducing the parasitic capacitance as the capacitance sensor. Furthermore, the auxiliary electrode become less noticeable to improve the designing properties. In addition to the above effects, Example 2 uses PEN film for the substrate to improve ultraviolet light absorbing properties and gas barrier properties of the substrate thereby suppressing the influence of ultraviolet light and gas in the substrate.

(B) Example 3 uses PC film for the substrate to provide the transparent electrode capacitance sensor with less birefringence and excellent optical properties in addition to the effects common to Examples 1 and 2.

(C) Example 5 basically employs the configuration of Example 4, but is further provided with the carbon printing at the connection between the PEDOT/PSS and the Ag lead wire. Since the solution of PEDOT/PSS is acidic, in a case where the Ag lead wire is formed in advance, the Ag lead wire may be oxidized due to the contact with the solution of PEDOT/PSS. In this regard, Example 5 employs the carbon printing in the portion in contact with the solution of PEDOT/PSS to avoid the oxidation of the Ag lead wire, thereby improving the reliability of the connection.

While the surface resistance of the pseudo auxiliary electrode varies depending on the thickness of the pseudo auxiliary electrode, it may be, for example, about 200Ω/□. Furthermore, the pseudo auxiliary electrode preferably has a thickness greater than that of the transparent electrode by 0.1 μm or above, more preferably 0.2 μm or above, and most preferably 0.5 μm or above. As such, the pseudo auxiliary electrode portion can be formed of the same material as the transparent electrode portion while reducing the electric resistance of the pseudo auxiliary electrode portion.

Next, Example 6-8 with respect to the afore-mentioned third and fourth embodiments will be hereinafter described.

Example 6

As shown in FIGS. 8A and 8B, the lead wire 13 of Cu metal vapor deposition film was formed on the polyethylene terephthalate (PET) transparent resin substrate 11, and PEDOT/PSS was then used to form the transparent electrode 12a and the pseudo auxiliary electrode 12b.

The entire surface of the PET film having a thickness of 50 μm was subjected to Cu deposition and then etching to form the lead wire 13 of Cu metal vapor deposition film. A solution of PEDOT/PSS having a viscosity of about $10C_p$ was applied in a predetermined pattern by an ink-jet apparatus such that it overlapped 1 mm of the end of the lead wire 13. The product thus obtained was slowly dried on a hot plate of about 60° C. and baked at the temperature of 120° C. for a period of 5 minutes to cause a coffee-ring (framing) phenomenon. As such, PEDOT/PSS pseudo auxiliary electrode 12b was formed at the outer periphery of the transparent electrode 12a. Subsequently, the adhesive layer 14 was formed over the entire surface of the substrate 11 including the transparent electrode 12a, the pseudo auxiliary electrode 12b and the lead wire 13 to obtain the transparent electrode capacitance sensor 1.

Example 7

As shown in FIGS. 10A and 10B, the lead wire 23b of Cu metal vapor deposition film was formed on the polyethylene terephthalate (PET) transparent resin substrate 21, and after the formation of the carbon layer 23a to cover the end of the lead wire 23b, PEDOT/PSS was used to form the transparent electrode 22a and the pseudo auxiliary electrode 22b.

The entire surface of the PET film having a thickness of 50 μm was subjected to Cu vapor deposition and then etching to form the lead wire 23b of Cu metal vapor deposition film. The carbon layer 23a was formed in 2 mm of the end of the lead wire 23b in accordance with PAD printing. A solution of PEDOT/PSS was applied by an ink jet apparatus such that it overlapped 1 mm of the end of the carbon layer 23a. In this regard, the outer periphery was thickened at a width of 0.5 mm as a result of the application. The product thus obtained was baked at the temperature of 120° C. for a period of 5 minutes to form the transparent electrode 22a and the pseudo auxiliary electrode 22b. Subsequently, the adhesive layer 24 was formed over the entire surface of the substrate 21 including the transparent electrode 22a, the pseudo auxiliary electrode 22b and the lead wire 23b. As such, the transparent electrode capacitance sensor 2 was obtained.

Example 8

As shown in FIGS. 11A and 11B, the lead wires 33c, 33b of Cu metal vapor deposition film were formed on the polyethylene terephthalate (PET) transparent resin substrate 31, and Ag nanowire-dispersed PEDOT/PSS was used to form the transparent electrodes 32a, 32e and the pseudo auxiliary electrodes 32b, 32d.

The entire surface of the PET film having a thickness of 100 μm was subjected to Cu vapor deposition and then etching to form the lead wires 33c, 33b of Cu metal vapor deposition film. Ag nanowire-dispersed PEDOT/PSS solution was applied in a predetermined pattern where a transmitting electrode and a receiving electrode were integrated by an ink jet apparatus such that it overlapped 1 mm of the ends of the lead wires 33c, 33b respectively. The outer periphery was thickened at the width of 0.5 mm as a result of the application. The product thus obtained was temporarily baked at low temperature and then ultraviolet-cured. Subsequently, dry etching was performed to form the Ag nanowire-dispersed PEDOT/PSS-containing, transparent electrode 32a (i.e., the transmitting side) and pseudo auxiliary electrode 32b, as well as, transparent electrode 32e (i.e., the receiving side) and pseudo auxiliary electrode 32d in a divided manner Subsequently, the adhesive layer 34 was formed over the entire surface of the substrate 31 including the transparent electrodes 32a, 32e, the pseudo auxiliary electrodes 32b, 32d and the lead wires 33c, 33b. As such, the transparent electrode capacitance sensor 3 was obtained.

Examples 6-8 have proved that the following effects are obtained: (A) Examples 6 and 8 use Cu metal vapor deposition film which is formed on the PET film in advance as the lead wire to cause the lead wire with a very small amount of level difference to be finely formed in the pseudo auxiliary electrode including the connection between the lead wire and the pseudo auxiliary electrode. As a result, the transparent electrode capacitance sensor with excellent flexibility and the great portion of viewable area can be manufactured.

(B) In Example 7, the carbon layer is interposed between the Cu metal vapor deposition film of Example 1 and the PEDOT/PSS pseudo auxiliary electrode to avoid the oxidation of the lead wire, thereby providing the transparent electrode capacitance sensor with improved reliability of the connection in comparison to Example 6.

While the surface resistance of the PEDOT/PSS pseudo auxiliary electrode varies depending on the thickness of the pseudo auxiliary electrode, it can be reduced to, for example, about 200Ω/□. On the other hand, Ag nanowire-dispersed PEDOT/PSS pseudo auxiliary electrode can further reduce the surface resistance of the pseudo auxiliary electrode. In a case where the Ag nanowire-dispersed PEDOT/PSS is used in the transparent electrode, the surface resistance of the transparent electrode can be reduced to, for example, about 80Ω/□. In a case where the Ag nanowire-dispersed PEDOT/PSS is used in the pseudo auxiliary electrode, the surface resistance of the pseudo auxiliary electrode can be reduced to, for example, about 40 to about 50Ω/□. Moreover, the pseudo auxiliary electrode preferably has a thickness greater than that of the transparent electrode by 0.1 μm or above, more preferably 0.2 μm or above, most preferably 0.5 μm or above. As such, the pseudo auxiliary electrode portion can be formed of the same material as the transparent electrode portion while reducing the electric resistance of the pseudo auxiliary electrode portion.

Next, Example 9-13 with respect to the afore-mentioned fifth embodiment will be hereinafter described.

Example 9

As shown in FIGS. 17A and 17B, PEDOT/PSS was used to form the transparent electrode 22a and the pseudo auxiliary electrode 22b on the polyethylene terephthalate (PET) transparent resin substrate 21 and the lead wire 23 of Ag paste was then formed such that it is connected to the portion of transparent electrode 22a which remains outside one side of the pseudo auxiliary electrode 22b (see right side in FIG. 17A).

A solution of PEDOT/PSS having a viscosity of about $10C_p$ was applied onto a PET film transparent resin substrate 21 having a thickness of 50 μm in a predetermined pattern in accordance with ink-jet method so as to form the transparent electrode 22a. Then, the same solution of PEDOT/PSS having a viscosity of about $10C_p$ was used to form the pseudo auxiliary electrode 22b in accordance with ink-jet method such that the transparent electrode 22a remains outside one side of the pseudo auxiliary electrode 22b (i.e., the right side), as shown in FIG. 17A. Subsequently, the lead wire 23 was formed using Ag paste having an electric resistance lower than that of the transparent electrode 22a such that it overlapped a portion of the transparent electrode 22a which remains outside the one side of the pseudo auxiliary electrode 22b, and the adhesive layer 24 was then formed over the entire surface of the substrate 21 including the transparent electrode 22a, the pseudo auxiliary electrode 22b and the lead wire 23. As such, the transparent electrode capacitance sensor 2 was obtained.

The thickness of the transparent electrode 22a was from 0.05 μm to 5 the additional thickness of the pseudo auxiliary electrode 22b disposed on the transparent electrode 22a was from 0.3 μm to 3 μm, and the thickness of the lead wire 23 of Ag paste was from 5 μm to 20 μm.

Example 10

As shown in FIGS. 18A and 18B, PEDOT/PSS was used to form the transparent electrode 32a and the pseudo auxiliary electrode 32b having a pair of projections 32c outside one side thereof (i.e., right side in FIG. 18A) on the polyethylene terephthalate (PET) transparent resin substrate 31 and the lead wire 33 of Ag paste was then formed such that it is connected to the transparent electrode 32a which was disposed between the pair of projections 32c of the pseudo auxiliary electrode 32b.

A solution of PEDOT/PSS having a viscosity of about 10$C_p$ was applied onto a PET film transparent resin substrate 31 having a thickness of 50 µm in a predetermined pattern by an ink-jet apparatus so as to form the transparent electrode 32a. Then, the same solution of PEDOT/PSS having a viscosity of about 10$C_p$ was used to form the pseudo auxiliary electrode 32b having a pair of projections 32c in accordance with ink-jet method such that the transparent electrode 32a remains outside one side of the pseudo auxiliary electrode 32b (i.e., the right side), as shown in FIG. 18A. Subsequently, the lead wire 33 was formed using Ag paste having an electric resistance lower than that of the transparent electrode 32a such that it overlapped a portion of the transparent electrode 32a which was disposed between the pair of projections 32c of the pseudo auxiliary electrode 32b, and the adhesive layer 34 was then formed over the entire surface of the substrate 31 including the transparent electrode 32a, the pseudo auxiliary electrode 32b and the lead wire 33. As such, the transparent electrode capacitance sensor 3 was obtained.

The thickness of the transparent electrode 32a was from 0.05 µm to 5 µm, the additional thickness of the pair of projections 32c of the pseudo auxiliary electrode 32b on the transparent electrode 32a was from 0.3 µm to 3 µm, and the thickness of the lead wire 33 of Ag paste was from 5 µm to 20 µm.

Example 11

As shown in FIGS. 19A and 19B, PEDOT/PSS was used to form the transparent electrode 42a and the pseudo auxiliary electrode 42b having a pair of projections 42c outside one side thereof (i.e., right side in FIG. 19A) on the polyethylene terephthalate (PET) transparent resin substrate 41. A pattern of the lead wire 33 was formed between the pair of projections 42c of the pseudo auxiliary electrode 42b in accordance with Cu metal vapor deposition in advance, and the transparent electrode 42a was formed on the lead wire 43 thus obtained.

After the formation of pattern of the lead wire 43 in a predetermined region of PET film transparent resin substrate 41 having a thickness of 50 µm in accordance with Cu metal vapor deposition, a solution of PEDOT/PSS having a viscosity of about 10$C_p$ was applied thereto using an ink-jet apparatus so as to form the transparent electrode 42a. Then, the same solution of PEDOT/PSS having a viscosity of about 10$C_p$ was used to form the pseudo auxiliary electrode 42b having a pair of projections 42c in accordance with ink-jet method such that the transparent electrode 42a remained in the location which was outside one side of the pseudo auxiliary electrode 42b (i.e., the right side in FIG. 19A) and where the lead wire 43 was located, as shown in FIG. 19A. The lead wire 43 having the electric resistance less than that of the transparent electrode 42a and formed by Cu metal vapor deposition in advance was disposed such that one end thereof overlapped 1 mm of the end of the transparent electrode 42a which was disposed between the pair of projections 42c of the pseudo auxiliary electrode 42b, and the adhesive layer 44 was then formed over the entire surface of the substrate 41 including the transparent electrode 42a, the pseudo auxiliary electrode 42b and the lead wire 43. As such, the transparent electrode capacitance sensor 4 was obtained.

The thickness of the transparent electrode 42a was from 0.05 µm to 5 µm, the additional thickness of the pair of projections 42c of the pseudo auxiliary electrode 42b on the transparent electrode 42a was from 0.3 µm to 3 µm, and the thickness of the lead wire 43 formed by Cu metal vapor deposition was from 0.1 µm to 3 µm.

Example 12

As shown in FIGS. 20A and 20B, PEDOT/PSS was used to form the transparent electrode 52a and the pseudo auxiliary electrode 52b on the polyethylene terephthalate (PET) transparent resin substrate 51 and the lead wire 53 of Ag paste was then formed such that it is connected to the transparent electrode 52a which was disposed between the pair of projections 52c of the pseudo auxiliary electrode 52b.

A solution of PEDOT/PSS having a viscosity of about 10$C_p$ was applied onto a PET film transparent resin substrate 51 having a thickness of 50 µm in a predetermined pattern in accordance with ink jet method so as to form the transparent electrode 52a. Subsequently, the same solution of PEDOT/PSS having a viscosity of about 10$C_p$ was used to form the pseudo auxiliary electrode 52b and a pair of projections 52c as shown in FIG. 20A in accordance with ink-jet method. The thickness of the pseudo auxiliary electrode 52b which was formed inside the transparent electrode 52a as shown in FIG. 20A was less than the thickness of the pseudo auxiliary electrodes 22b, 32b which were formed at the outer periphery of the transparent electrodes 22a 32a in Examples 9 and 10 (see FIGS. 17A and 18A) respectively. The thickness of the pair of projections 52c of the pseudo auxiliary electrode 52b of FIG. 20A was equal to the thickness of pseudo auxiliary electrodes 22b, 32b which were formed at the outer periphery of the transparent electrodes 22a, 32a in Examples 9 and 10 (see FIGS. 17A and 18A) respectively. Subsequently, the lead wire 33 was formed using Ag paste having an electric resistance lower than that of the transparent electrode 52a such that it overlapped a portion of the transparent electrode 52a which was disposed between the pair of projections 52c of the pseudo auxiliary electrode 52b, and the adhesive layer 54 was then formed over the entire surface of the substrate 51 including the transparent electrode 52a, the pseudo auxiliary electrode 52b, the pair of projections 52c, and the lead wire 53. As such, the transparent electrode capacitance sensor 5 was obtained.

The thickness of the transparent electrode 52a was from 0.05 µm to 5 µm, the additional thickness of the pair of projections 52c of the pseudo auxiliary electrode 52b on the transparent electrode 52a was from 0.3 µm to 3 µm, and the thickness of the lead wire-53 of Ag paste was from 5 µm to 20 µm.

Example 13

As shown in FIGS. 21A and 21B, Ag nanowire-dispersed PEDOT/PSS transparent electrode 62a and Ag nanowire-dispersed PEDOT/PSS pseudo auxiliary electrode 62b were formed on the polyethylene terephthalate (PET) transparent resin substrate 61 and the lead wire 63 of Ag paste was then formed such that it is connected to the transparent electrode 62a which was disposed between the pair of projections 62c of the pseudo auxiliary electrode.

A solution of Ag nanowire-dispersed PEDOT/PSS having a viscosity of about 10$C_p$ was applied onto a PET film transparent resin substrate 61 having a thickness of 50 µm in a predetermined pattern in accordance with ink-jet method so as to form the transparent electrode 62a. Subsequently, a solution of Ag nanowire-dispersed PEDOT/PSS was used to form the pseudo auxiliary electrode 62b and a pair of projections 62c as shown in FIG. 21A in accordance with ink-jet method. The thickness of the pseudo auxiliary electrode 62*b* which was formed inside the transparent electrode 62*a* as shown in FIG. 21A was less than the thickness of the pseudo auxiliary electrodes 22*b*, 32*b* which were formed at the outer periphery of the transparent electrodes 22*a*, 32*a* in Examples 9 and 10 (see FIGS. 17A and 18A) respectively. The thickness of the pair of projections 62*c* of the pseudo auxiliary electrode of FIG. 21A was less than the thickness of pseudo auxiliary electrodes 22*b*, 32*b* which were formed at the outer periphery of the transparent electrodes 22*a*, 32*a* in Examples 9 and 10 (see FIGS. 17A and 18A) respectively. Subsequently, the lead wire 63 was formed using Ag paste having an electric resistance lower than that of the transparent electrode 62*a* such that it overlapped a portion of the transparent electrode 62*a* which was disposed between the pair of projections 62*c* of the pseudo auxiliary electrode, and the adhesive layer 64 was then formed over the entire surface of the substrate 61 including the transparent electrode 62*a*, the pseudo auxiliary electrode 62*b*, the pair of projections 62*c*, and the lead wire 63. As such, the transparent electrode capacitance sensor 6 was obtained.

The thickness of the transparent electrode 62*a* was from 0.05 μm to 5 μm, the additional thickness of the pair of projections 62*c* of the pseudo auxiliary electrode containing Ag nanowire on the transparent electrode 62*a* was from 0.1 μm to 1 μm, and the thickness of the lead wire 63 of Ag paste was from 5 μm to 20 μm.

Examples 9-13 have proved that the following effects are obtained: (A) Compared to the conventional auxiliary electrode which is formed of Ag ink and the like, Examples 9 and 10 can produces thin, light transmitting pseudo auxiliary electrode, thereby greatly reducing the level difference between the transparent electrode and the pseudo auxiliary electrode, suppressing the bubbling in a border of OCA layer, and reducing the parasitic capacitance. Furthermore, the lead wire is disposed outside the viewable area of the electrode to be less noticeable and to improve the designing properties. (B) Since Example 11 employs thinner Cu metal vapor deposition film as the lead wire in comparison with Examples 9 and 10, most of the region where the level difference is created can be removed. (C) In Example 12, the properties of the center portion of the transparent electrode can be further stabilized in comparison with Examples 9 and 10. (D) Since Example 13 employs high conductive Ag nanowire-dispersed PEDOT/PSS in the formation of the pseudo auxiliary electrode, the center portion of the pseudo auxiliary electrode becomes less noticeable, thereby further improving the designing properties in comparison with Example 11.

While the surface resistance of the PEDOT/PSS pseudo auxiliary electrode varies depending on the thickness of the pseudo auxiliary electrode, it can be reduced to, for example, about 200Ω/□. On the other hand, Ag nanowire-dispersed PEDOT/PSS pseudo auxiliary electrode can further reduce the surface resistance of the pseudo auxiliary electrode. In a case where the Ag nanowire-dispersed PEDOT/PSS is used in the transparent electrode, the surface resistance of the transparent electrode can be reduced to, for example, about 80Ω/□. In a case where the Ag nanowire-dispersed PEDOT/PSS is used in the pseudo auxiliary electrode, the surface resistance of the pseudo auxiliary electrode can be reduced to, for example, about 40 to about 50Ω/□. Moreover, the pseudo auxiliary electrode preferably has a thickness greater than that of the transparent electrode by 0.1 μm or above, more preferably 0.2 μm or above, most preferably 0.5 μm or above. As such, the pseudo auxiliary electrode can be formed of the same material as the transparent electrode while reducing the electric resistance of the pseudo auxiliary electrode.

As described above, in accordance with the embodiment of the process for manufacturing the transparent electrode capacitance sensor, the level difference between the transparent electrode and the pseudo auxiliary electrode can be 6 μm or below, and further 3 μm or below.

Effect of Embodiments

As described above, the embodiments of the present invention are different from the conventional art in that the auxiliary electrode which is formed at a portion of the outer periphery of the transparent electrode is formed of the same material as the transparent electrode. For the above reason, the auxiliary electrode is improved in transparency and is thus less noticeable, thereby attaining excellent designing properties, in comparison with the conventional auxiliary electrode. In addition, since the pseudo auxiliary electrode is formed of the same material as the transparent electrode, cost for material can be suppressed in comparison with the conventional art where expensive material such as silver is used. Furthermore, even if the pseudo auxiliary electrode is formed of the same material as the transparent electrode and thus thicker than the transparent electrode, it can be made much thinner than the conventional auxiliary electrode which is formed of the conventional material for the auxiliary electrode. As a result, the level difference between the transparent electrode and the pseudo auxiliary electrode can be remarkably reduced, thereby suppressing bubbling due to the level difference during the formation of the adhesive layer, and reducing the parasitic capacitance. When the screen printing or ink-jet printing is used for the formation of the pseudo auxiliary electrode, the freedom of extent of forming the pseudo auxiliary electrode is increased. As a result, the area of the pseudo auxiliary electrode may be reduced to preferably enlarge the viewable area.

As described above, the transparent electrode and the pseudo auxiliary electrode may be formed by multiple printing (i.e., multiple application) of the material for the transparent electrode. In this case, while the same material (i.e., the same transparent electrode material) is used for each printing (i.e., each application), there is a case where the adjustment of viscosity of the material is needed, for example, to avoid the flow of the material into uncoated region after the application of the material and before the completion of the drying process. In this regard, an amount of diluent and the like may be adjusted to attain a proper viscosity. The diluent is basically evaporated in the process of drying and no or less diluent remains after the process of drying. However, in spite of the afore-mentioned difference (i.e., difference in viscosity and etc.), the above material interpreted to mean the same material.

While the ink-jet printing or screen printing are mentioned in the preferred embodiment, it is apparent that a general printing method such as PAD printing or flexographic printing may be used. Furthermore, while the solution of PEDOT/PSS forming conductive polymer where Ag nanowire is dispersed is used in the third and fourth embodiments, due to the conductivity of Ag nanowire itself, a solution forming non-conductive polymer may be used. In addition, the transparent electrode 62*a*, the pseudo auxiliary electrode 62*b* (including the projection 62*c*) and the like may be formed of only Ag nanowire.

While a preferred embodiment of the present invention has been shown and described with particularity, it will be appreciated that various changes and modifications may suggest themselves to one having ordinary skill in the art upon being apprised of the present invention. It is also intended to encompass all such changes and modifications as fall within the scope and spirit of the appended claims.

REFERENCE SIGNS LIST 1, 2, 3, 4, 5, 6: transparent electrode capacitance sensor
11, 21, 31, 41, 51, 61: transparent resin substrate
12a, 22a, 32a, 42a, 52a, 62a: transparent electrode
12b, 22b, 32b, 32d, 42b, 52b, 62b: pseudo auxiliary electrode
12c: notch portion
13, 23, 23b, 33, 33b, 33c, 43, 43b, 53, 63: lead wire
14, 24, 34, 44, 54, 64: adhesive layer
15: jig plate
23a: carbon layer
32a: transparent electrode (transmitting side)
32e: transparent electrode (receiving side)
33a: carbon printing
32c, 42c, 52c, 62c: a pair of projections
$t_p$: level difference (step)

The invention claimed is:

1. A transparent electrode capacitance sensor, comprising a transparent resin substrate;
at least one transparent electrode formed on the transparent resin substrate;
a pseudo auxiliary electrode formed in at least a portion of an outer periphery of the transparent electrode, the pseudo auxiliary electrode being thicker than the transparent electrode, integral with the transparent electrode, and made of a same material as the transparent electrode;
a lead wire connected to the pseudo auxiliary electrode, the lead wire being formed on the transparent resin substrate, and comprising a metal vapor deposition film; and
a carbon layer formed in a connection between the lead wire and the pseudo auxiliary electrode, the lead wire being connected to the pseudo auxiliary electrode through the carbon layer.

2. The transparent electrode capacitance sensor according to claim 1, wherein the lead wire is connected to the pseudo auxiliary electrode through the transparent electrode.

3. The transparent electrode capacitance sensor according to claim 1, wherein a thickness of the pseudo auxiliary electrode is greater than that of the transparent electrode by 6 μm or less.

4. The transparent electrode capacitance sensor according to claim 1, wherein a thickness of the pseudo auxiliary electrode is greater than that of the transparent electrode by 4 μm or less.

5. The transparent electrode capacitance sensor according to claim 1, wherein the pseudo auxiliary electrode is formed in an extent of ⅐ or more of the outer periphery of the transparent electrode.

6. The transparent electrode capacitance sensor according to claim 1, wherein the lead wire has a thickness of from 0.1 μm to 3 μm.

7. The transparent electrode capacitance sensor according to claim 2, wherein the lead wire is spaced apart from the pseudo auxiliary electrode by one to ten times a thickness of the lead wire in a plan view.

8. The transparent electrode capacitance sensor according to claim 2, wherein the carbon layer is formed on the lead wire, and a portion of the lead wire on which the carbon layer is formed is connected to the pseudo auxiliary electrode through the transparent electrode.

9. The transparent electrode capacitance sensor according to claim 1, wherein the lead wire covers at least one portion of the pseudo auxiliary electrode.

* * * * *